United States Patent
Horiguchi et al.

(10) Patent No.: US 11,630,156 B2
(45) Date of Patent: Apr. 18, 2023

(54) BATTERY MONITORING APPARATUS

(71) Applicant: DENSO CORPORATION, Kariya (JP)

(72) Inventors: Masakatsu Horiguchi, Kariya (JP);
Masaaki Kitagawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 340 days.

(21) Appl. No.: 16/925,437

(22) Filed: Jul. 10, 2020

(65) Prior Publication Data

US 2021/0018567 A1  Jan. 21, 2021

(30) Foreign Application Priority Data

Jul. 19, 2019  (JP) .............................. JP2019-133548

(51) Int. Cl.
*G01R 31/00*    (2006.01)
*G01R 31/36*    (2020.01)
*G01R 31/382*   (2019.01)
*G01R 31/389*   (2019.01)
*G01R 31/392*   (2019.01)
*H01M 10/48*    (2006.01)
*G01R 27/02*    (2006.01)
*H02J 7/00*     (2006.01)
*G01R 31/396*   (2019.01)

(52) U.S. Cl.
CPC ......... *G01R 31/3648* (2013.01); *G01R 27/02* (2013.01); *G01R 31/382* (2019.01); *G01R 31/389* (2019.01); *G01R 31/392* (2019.01); *G01R 31/396* (2019.01); *H01M 10/482* (2013.01); *H02J 7/0013* (2013.01); *H02J 7/0047* (2013.01); *H01M 2220/20* (2013.01)

(58) Field of Classification Search
USPC ........................... 324/426, 430–435; 428/90
See application file for complete search history.

(56) References Cited

U.S. PATENT DOCUMENTS

| | | |
|---|---|---|
| 2016/0195577 A1 | 7/2016 | Osaka et al. |
| 2019/0067714 A1 | 2/2019 | Oguma et al. |
| 2020/0256924 A1* | 8/2020 | Hoermaier ........... G01R 31/389 |
| 2021/0003638 A1* | 1/2021 | Mizoguchi ........... G01R 31/389 |

FOREIGN PATENT DOCUMENTS

WO    2020/218373 A1    10/2020

* cited by examiner

*Primary Examiner* — Vincent Q Nguyen
(74) *Attorney, Agent, or Firm* — Oliff PLC

(57) ABSTRACT

A battery monitoring apparatus includes an electric power supply terminal connected with a first electrical path, a voltage input terminal connected with a second electrical path, a signal control unit connected with a third electrical path, a response signal input terminal connected with a fourth electrical path, and a calculating unit. The signal control unit is configured to cause a predetermined AC signal to be outputted from a storage battery with the storage battery itself being an electric power source for the output of the predetermined AC signal. The calculating unit is configured to calculate, based on a response signal of the storage battery to the predetermined AC signal, a complex impedance of the storage battery. Moreover, at least one of the first to the fourth electrical paths is merged with at least one of the other electrical paths into an electrical path that is connected to the storage battery.

9 Claims, 17 Drawing Sheets

BATTERY MONITORING APPARATUS

CROSS-REFERENCE TO RELATED APPLICATION

This application is based on and claims priority from Japanese Patent Application No. 2019-133548 filed on Jul. 19, 2019, the contents of which are hereby incorporated by reference in their entirety into this application.

BACKGROUND

1 Technical Field

The present disclosure relates to battery monitoring apparatuses.

2 Description of Related Art

There is known a technique of measuring the complex impedance of a storage battery and thereby monitoring a state of the storage battery. Specifically, according to this technique, a rectangular-wave signal is applied to the storage battery. Then, the complex impedance characteristics of the storage battery are calculated based on a response signal of the storage battery to the rectangular-wave signal. Thereafter, the SOH (i.e., state of health) of the storage battery is determined based on the calculated complex impedance characteristics.

SUMMARY

According to the present disclosure, there is provided a battery monitoring apparatus for monitoring a state of a storage battery. The battery monitoring apparatus includes:

an electric power supply terminal which is connected with a first electrical path and via which drive electric power is supplied from the storage battery to the battery monitoring apparatus through the first electrical path;

a voltage input terminal which is connected with a second electrical path and via which a terminal voltage of the storage battery is inputted to the battery monitoring apparatus through the second electrical path so as to be measured by the battery monitoring apparatus;

a signal control unit connected with a third electrical path and configured to cause a predetermined AC signal to be outputted from the storage battery through the third electrical path;

a response signal input terminal which is connected with a fourth electrical path and via which a response signal of the storage battery to the AC signal is inputted to the battery monitoring apparatus through the fourth electrical path; and a calculating unit configured to calculate, based on the response signal, a complex impedance of the storage battery, wherein the signal control unit is configured to cause the predetermined AC signal to be outputted from the storage battery with the storage battery itself being an electric power source for the output of the predetermined AC signal, and at least one of the first electrical path, the second electrical path, the third electrical path and the fourth electrical path is merged with at least one of the other electrical paths into an electrical path that is connected to the storage battery.

DESCRIPTION OF EMBODIMENTS

Figure 1:
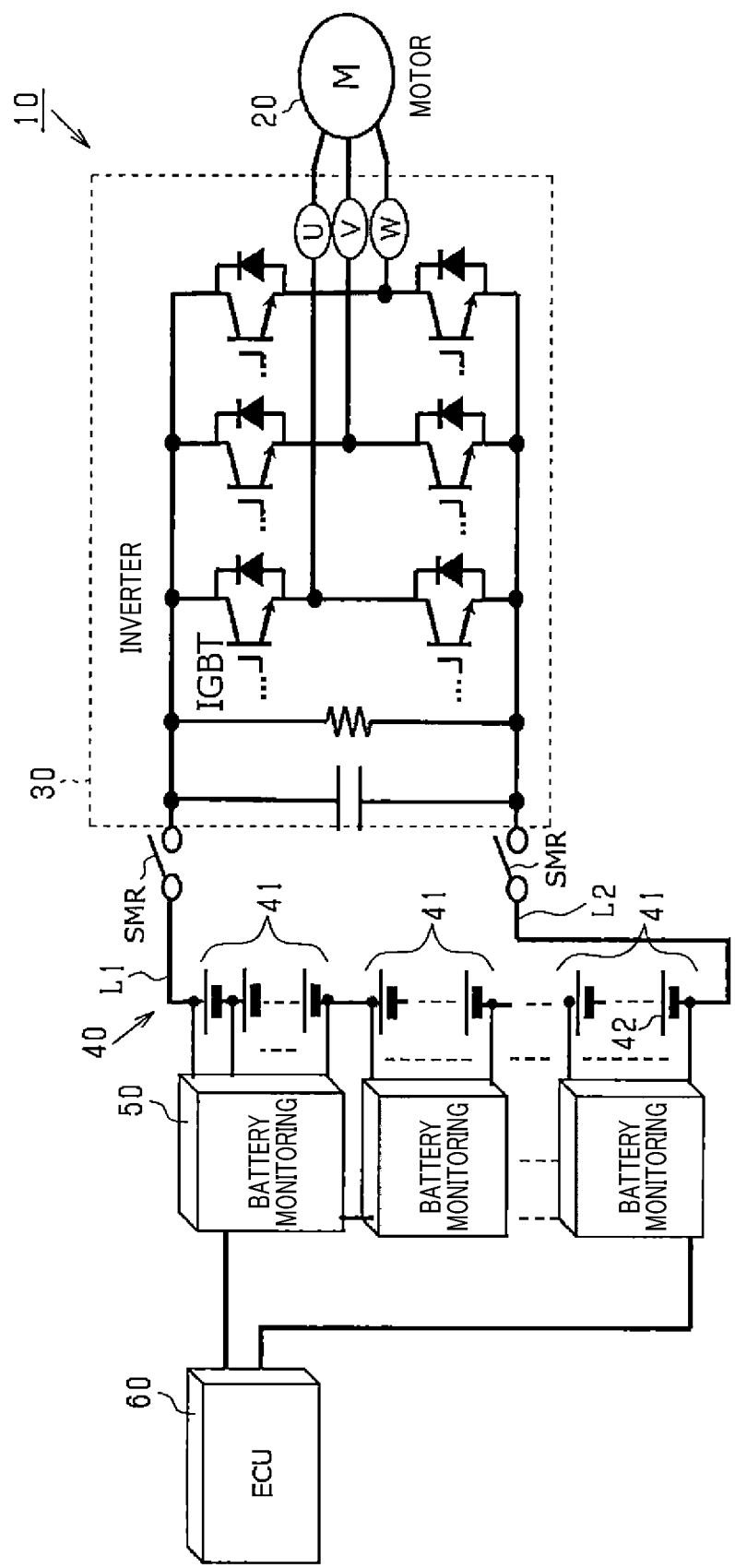
FIG. 1 is a schematic configuration diagram of an electric power supply system.

The inventors of the present application have found that the following problems may occur when the above-described technique known in the art (see, for example, Japanese Patent No. JP6226261B2) is used in a battery monitoring apparatus to measure the complex impedance of a vehicular storage battery. That is, it is necessary to employ a device, such as a power controller, for applying the rectangular-wave signal to the storage battery. The employment of such a device will cause the size and manufacturing cost of the battery monitoring apparatus to be increased. Moreover, it is necessary to provide in the battery monitoring apparatus various terminals, such as terminals for inputting/outputting electric power, terminals for outputting signals to the storage battery, terminals for measuring the voltage of the storage battery and terminals for measuring the response signal of the storage battery. Consequently, the number of terminals of the battery monitoring apparatus will become large, increasing the time and cost for connecting the terminals of the battery monitoring apparatus to electric power supply terminals of the storage battery during the assembly of the battery monitoring apparatus to the storage battery. This problem is remarkable particularly when the above technique is used to monitor a state of a vehicular battery pack that is composed of a plurality of storage batteries.

In contrast, in the above-described battery monitoring apparatus according to the present disclosure, the signal control unit causes the predetermined AC signal to be outputted from the storage battery with the storage battery itself being the electric power source for the output of the predetermined AC signal. Consequently, it becomes unnecessary to employ an external electric power source for applying a disturbance to the storage battery (i.e., causing the predetermined AC signal to be outputted from the storage battery) for the purpose of measuring the complex impedance of the storage battery. As a result, it becomes possible to reduce the parts count and the size of the battery monitoring apparatus, thereby lowering the manufacturing cost.

Moreover, to an in-vehicle storage battery, there are generally connected peripheral devices such as a protective element and a filter circuit. Therefore, when an AC signal is inputted as a disturbance to the storage battery, part of the AC signal may be leaked to the peripheral devices. Consequently, if the complex impedance of the storage battery is calculated based on a response signal of the storage battery to the inputted AC signal, it might be impossible to ensure the accuracy of calculation of the complex impedance due to an error in the response signal caused by the leakage of the AC signal.

In contrast, with the above configuration of the battery monitoring apparatus according to the present disclosure, the signal control unit causes the predetermined AC signal to be outputted from the storage battery with the storage battery itself being the electric power source for the output of the predetermined AC signal. Consequently, it becomes possible to realize a closed circuit with the signal control unit and the storage battery. As a result, it becomes possible to eliminate current leakage from the storage battery to the peripheral devices, thereby suppressing occurrence of an error in the response signal.

Furthermore, with the above configuration, at least one of the first electrical path, the second electrical path, the third electrical path and the fourth electrical path is merged with at least one of the other electrical paths. Consequently, it becomes possible to reduce the number of the electrical paths of the battery monitoring apparatus joined to electric power supply terminals of the storage battery. As a result, it becomes possible to reduce the time and cost for joining the electrical paths to the electric power supply terminals during the assembly of the battery monitoring apparatus to the storage battery.

Exemplary embodiments will be described hereinafter with reference to the drawings. It should be noted that for the sake of clarity and understanding, identical components having identical functions throughout the whole description have been marked, where possible, with the same reference numerals in each of the figures and that for the sake of avoiding redundancy, descriptions of identical components will not be repeated.

First Embodiment

FIG. 1 shows the overall configuration of an electric power supply system 10 which is provided in a vehicle (e.g., a hybrid vehicle or an electric vehicle) and in which battery monitoring apparatuses 50 according to the first embodiment are employed.

As shown in FIG. 1, the electric power supply system 10 includes a motor 20 that is a rotating electric machine, an inverter 30 that functions as an electric power converter to supply three-phase alternating current to the motor 20, a rechargeable battery pack 40, battery monitoring apparatuses 50 for monitoring a state of the battery pack 40, and an ECU 60 that controls the motor 20 and the inverter 30.

The motor 20 is a main machine of the vehicle. The motor 20 is mechanically connected with driving wheels (not shown) of the vehicle so that mechanical power (or torque) can be transmitted between the motor 20 and the driving wheels. In the present embodiment, the motor 20 is implemented by a three-phase permanent magnet synchronous motor.

The inverter 30 is configured with a full bridge circuit having a plurality of pairs of upper and lower arms. The number of pairs of the upper and lower arms is equal to the number of phase windings of the motor 20. Each of the upper and lower arms has a switch (or semiconductor switching element) provided therein. In operation, electric current supplied to the phase windings of the motor 20 is controlled by turning on/off the switches of the upper and lower arms.

Specifically, an inverter controller (not shown) is provided in the inverter 30. The inverter controller controls, based on various types of information detected in the motor 20 and a power running drive request (or torque generation request) or an electric power generation request, the on/off of the switches in the inverter 30, thereby controlling energization of the phase windings of the motor 20. More specifically, the inverter controller controls the supply of electric power from the battery pack 40 to the motor 20 via the inverter 30, thereby driving the motor 20 to operate in a power running mode (or torque generation mode). Otherwise, when the motor 20 operates in an electric power generation mode (i.e., the motor 20 is driven by mechanical power transmitted from, for example, the driving wheels of the vehicle to generate three-phase AC power), the inverter controller controls the inverter 30 to function as a rectifier to rectify the three-phase AC power generated by the motor 20 into a DC power; the DC power is then supplied to the battery pack 40 to charge it.

That is, in the present embodiment, the motor 20 is configured as a motor-generator that operates selectively in either the power running mode or the electric power generation mode. Moreover, the inverter 30 is configured as an electric power converter that functions selectively as either an inverter or a rectifier.

The battery pack 40 is electrically connected with the motor 20 via the inverter 30. The battery pack 40 has a terminal voltage (i.e., voltage between two terminals) higher than or equal to, for example 100V The battery pack 40 is configured with a plurality of battery modules 41 that are connected in series with each other. Moreover, each of the battery modules 41 is configured with a plurality of battery cells 42 that are connected in series with each other. The battery cells 42 may be implemented by, for example, lithium-ion batteries or nickel-metal hydride batteries. That is, each of the battery cells 42 is a storage battery which includes an electrolyte and a pair of electrodes.

To a positive-electrode-side electric power supply path L1 that is connected with a positive-electrode-side electric power supply terminal of the battery pack 40, there are connected positive-electrode-side terminals of electrical loads such as the inverter 30. On the other hand, to a negative-electrode-side electric power supply path L2 that is connected with a negative-electrode-side electric power supply terminal of the battery pack 40, there are connected negative-electrode-side terminals of the electrical loads. Moreover, in each of the positive-electrode-side and negative-electrode-side electric power supply paths L1 and L2, there is provided an SMR (i.e., system main relay) switch to selectively allow and interrupt flow of electric current through the electric power supply path.

The battery monitoring apparatuses 50 are provided to monitor the SOC (i.e., state of charge) and/or SOH (i.e., state of health) of each of the battery cells 42. More particularly, in the present embodiment, for each of the battery cells 42, there is provided a corresponding one of the battery monitoring apparatuses 50 to monitor the SOC and/or SOH of the battery cell 42. The battery monitoring apparatuses 50 are connected with the ECU 60 so as to output the monitored states of the battery cells 42 to the ECU 60. The configuration of the battery monitoring apparatuses 50 will be described in detail later.

The ECU 60 selectively makes, based on various types of information, either the power running drive request or the electric power generation request to the inverter controller. The various types of information include, for example, accelerator operation information, brake operation information, the vehicle speed and the state of the battery pack 40.

Next, the configuration of each of the battery monitoring apparatuses 50 according to the present embodiment will be described with reference to FIG. 2. In addition, as mentioned previously, in the present embodiment, for each of the battery cells 42, there is provided a corresponding one of the battery monitoring apparatuses 50.

Figure 2:
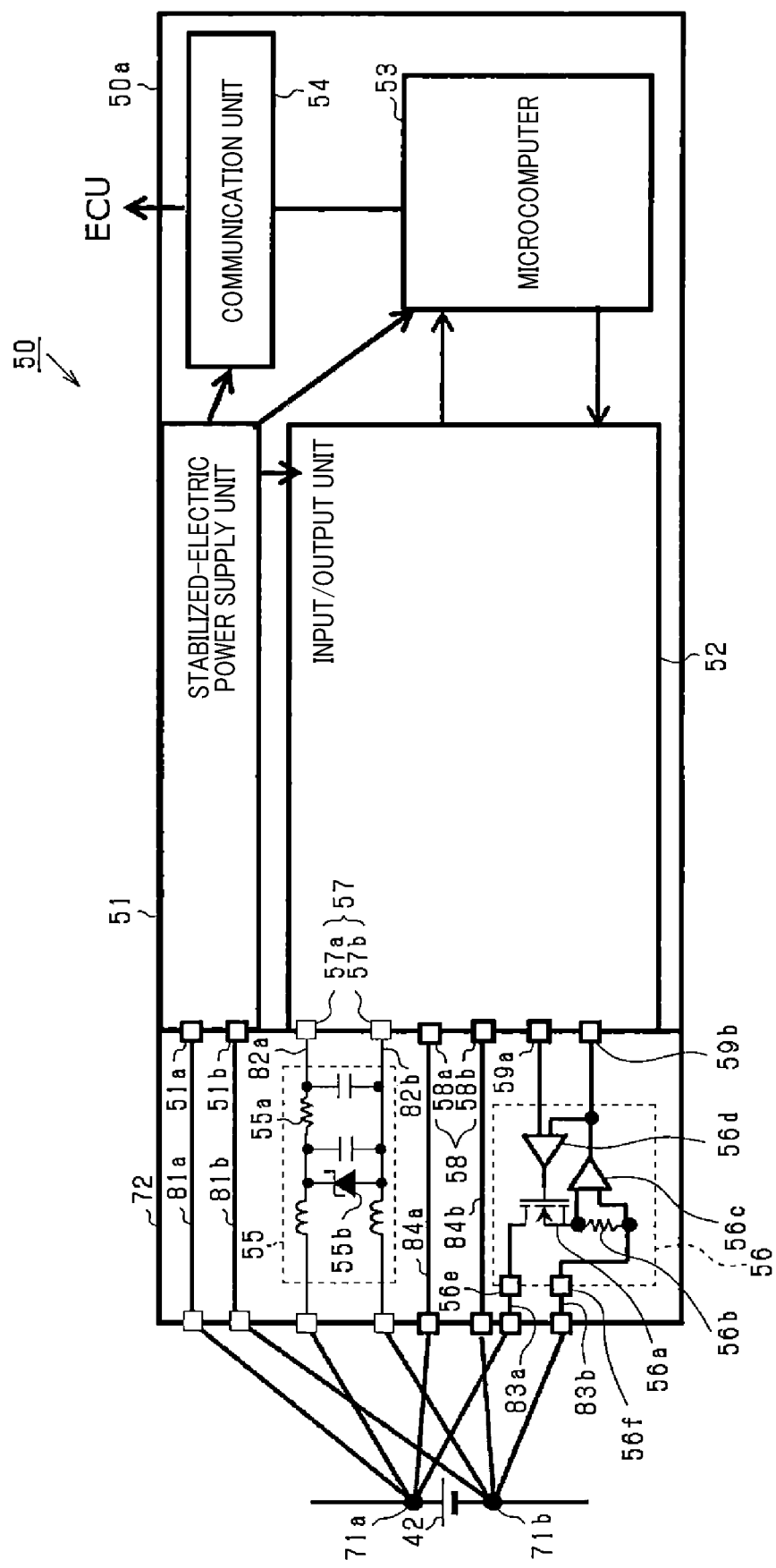
FIG. 2 is a configuration diagram of a battery monitoring apparatus according to a first embodiment.

As shown in FIG. 2, each of the battery monitoring apparatuses 50 includes an ASIC (Application-Specific Integrated Circuit) 50a, a filter unit 55 and a current modulation circuit 56.

The ASIC 50a includes a stabilized-electric power supply unit 51, an input/output unit 52, a microcomputer 53 that functions as a calculating unit, and a communication unit 54.

The stabilized-electric power supply unit 51 is connected with electric power supply lines of the battery cell 42. The stabilized-electric power supply unit 51 is configured to supply electric power from the battery cell 42 to the input/output unit 52, the microcomputer 53 and the communication unit 54. Consequently, the input/output unit 52, the microcomputer 53 and the communication unit 54 operate on the electric power supplied by the stabilized-electric power supply unit 51. The stabilized-electric power supply unit 51 has a positive-electrode-side terminal 51a and a negative-electrode-side terminal 51b that function as electric power supply terminals via which drive electric power is supplied from the battery cell 42 to the battery monitoring apparatus 50.

The input/output unit 52 is connected with the battery cell 42 that is the monitoring target. Specifically, the input/output unit 52 has DC voltage input terminals 57 via which the DC voltage (or terminal voltage) of the battery cell 42 is inputted to (or measured by) the battery monitoring apparatus 50. Between the battery cell 42 and the DC voltage input terminals 57, there is provided the filter unit 55. More specifically, the DC voltage input terminals 57 consist of a positive-electrode-side input terminal 57a and a negative-electrode-side input terminal 57b. On the other hand, the filter unit 55 has RC (Resistor-Capacitor) filters 55a as filter circuits and a Zener diode 55b as a protective element. The RC filters 55a and the Zener diode 55b are provided between the positive-electrode-side input terminal 57a and the negative-electrode-side input terminal 57b of the input/output unit 52. That is, the RC filters 55a and the Zener diode 55b are connected in parallel with the battery cell 42. In addition, in the present embodiment, the positive-electrode-side input terminal 57a and the negative-electrode-side input terminal 57b function as voltage input terminals via which the terminal voltage of the battery cell 42 is inputted to and measured by the battery monitoring apparatus 50.

Moreover, the input/output unit 52 also has response signal input terminals 58 via which a response signal (or voltage variation) indicative of the internal complex impedance information of the battery cell 42 is inputted to the battery monitoring apparatus 50. Specifically, the response signal input terminals 58 consist of a positive-electrode-side input terminal 58a and a negative-electrode-side input terminal 58b that function as response signal input terminals via which the response signal is inputted to the battery monitoring apparatus 50.

Furthermore, the input/output unit 52 is connected with the current modulation circuit 56 that functions as a signal control unit. The input/output unit 52 has a command signal output terminal 59a via which a command signal is outputted to the current modulation circuit 56; the command signal is indicative of a command commanding the current modulation circuit 56 to cause a predetermined sine-wave signal (or AC signal) to be outputted from the battery cell 42. Moreover, the input/output unit 52 also has a feedback signal input terminal 59b via which current signal, which is actually outputted from (or actually flows out of) the battery cell 42, is inputted as a feedback signal to the input/output unit 52 through the current modulation circuit 56.

The input/output unit 52 is also connected with the microcomputer 53 so as to output to the microcomputer 53 the DC voltage inputted via the DC voltage input terminals 57, the response signal inputted via the response signal input terminals 58 and the feedback signal inputted via the feedback signal input terminal 59b. In addition, the input/output unit 52 includes an AD (Analog-to-Digital) converter (not shown) therein; the AD converter is configured to convert inputted analog signals into digital signals and output the resultant digital signals to the microcomputer 53.

Moreover, the input/output unit 52 is configured to: input the command signal from the microcomputer 53; and output the command signal to the current modulation circuit 56 via the command signal output terminal 59a. In addition, the input/output unit 52 also includes a DA (Digital-to-Analog) converter (not shown) therein; the DA converter is configured to convert digital signals inputted from the microcomputer 53 into analog signals and output the resultant analog signals to the current modulation circuit 56.

In the present embodiment, a DC bias is applied to the sine-wave signal, which is commanded by the command signal to the current modulation circuit 56, so as to prevent the sine-wave signal from becoming a negative current (or reverse current with respect to the battery cell 42).

The current modulation circuit 56 is configured to cause a predetermined AC signal (i.e., sine-wave signal) to be outputted from the battery cell 42 that is the monitoring target, with the battery cell 42 itself being the electric power source for the output of the predetermined AC signal. Specifically, the current modulation circuit 56 includes a semiconductor switch element (e.g., a MOSFET) 56a and a resistor 56b connected in series with the semiconductor switch element 56a. The semiconductor switch element 56a has its drain terminal connected to a positive-electrode-side electric power supply terminal 71a of the battery cell 42 and its source terminal serially connected to one end of the resistor 56b. Moreover, the other end of the resistor 56b is connected to a negative-electrode-side electric power supply terminal 71b of the battery cell 42. The semiconductor switch element 56a is configured to be capable of regulating the amount of electric current flowing between its drain and its source.

Figure 5A:
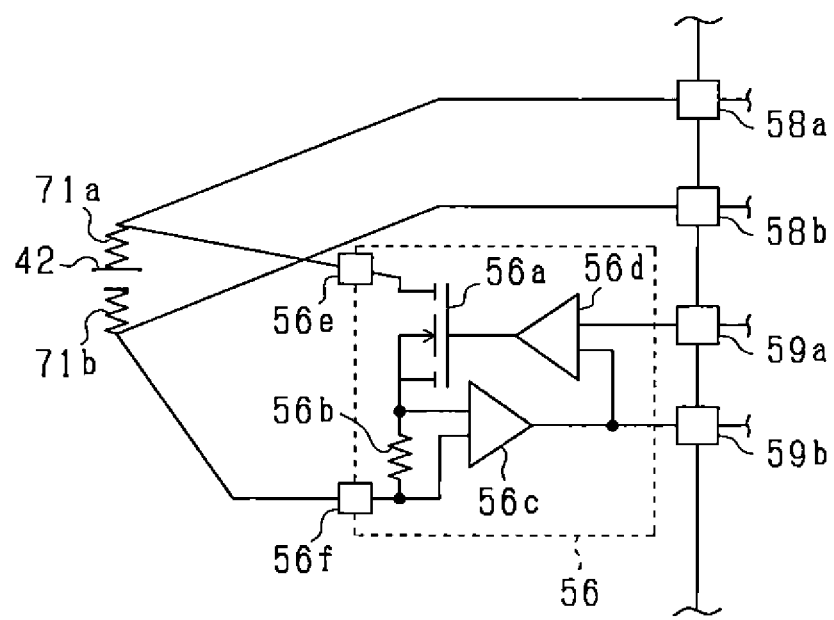
FIG. 5A is a schematic diagram illustrating undesirable locations at which response signal input terminals of the battery monitoring apparatus could be connected respectively to electric power supply terminals of the battery cell.
Figure 5B:
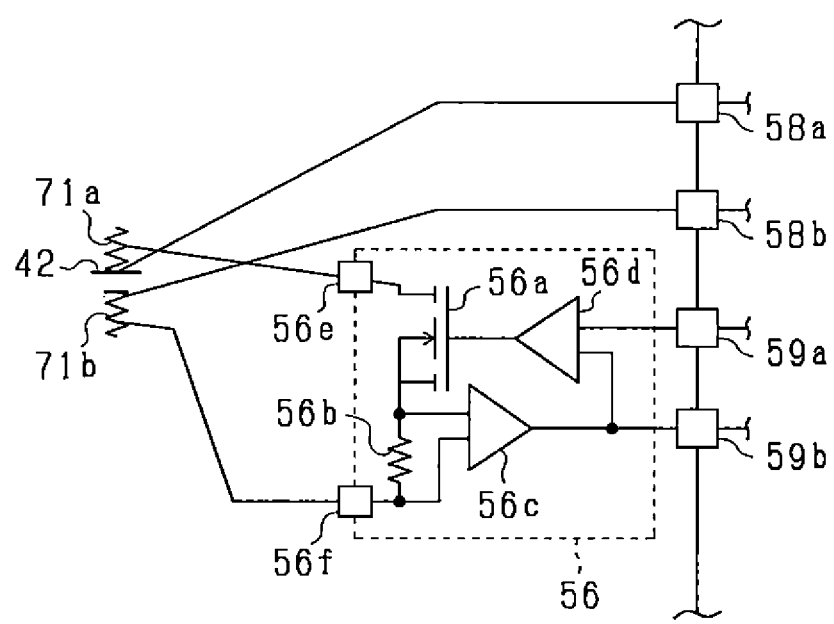
FIG. 5B is a schematic diagram illustrating desirable locations at which the response signal input terminals of the battery monitoring apparatus are connected respectively to the electric power supply terminals of the battery cell.

In addition, the positive-electrode-side and negative-electrode-side electric power supply terminals 71a and 71b of the battery cell 42 are connected respectively with positive and negative electrodes of the battery cell 42 (see FIGS. 5A-5B). It is desirable for the response signal input terminals 58 to be connected respectively to, of all connectable portions of the electric power supply terminals 71a and 71b of the battery cell 42, those connectable portions which are located closest to the electrodes of the battery cell 42 (see FIG. 5B). Similarly, it is desirable for the DC voltage input terminals 57 to be connected respectively to those connectable portions of the electric power supply terminals 71a and 71b which are located closest to the electrodes or those connectable portions of the electric power supply terminals 71a and 71b which are located second closest to the electrodes with the response signal input terminals 58 being connected to the closest connectable portions to the electrodes. In these cases, it is possible to minimize the influence of a voltage drop, which is caused by main current or equalization current, on the response signal inputted to the battery monitoring apparatus 50 via the response signal input terminals 58 and the DC voltage inputted to the battery monitoring apparatus 50 via the DC voltage input terminals 57.

Moreover, in the current modulation circuit 56, there is provided a current detection amplifier 56c which is connected to both ends of the resistor 56b to function as a current detection unit. Specifically, the current detection amplifier 56c is configured to detect a signal (i.e., current signal) flowing through the resistor 56b and output the detected signal as the feedback signal to the feedback signal input terminal 59b of the input/output unit 52.

Furthermore, in the current modulation circuit 56, there is also provided a feedback circuit 56d. The feedback circuit 56d is configured to: (1) input the command signal from the command signal output terminal 59a of the input/output unit 52 and the feedback signal from the current detection amplifier 56c; (2) compare the command signal and the feedback signal; and (3) output a signal indicative of the result of the comparison to a gate terminal of the semiconductor switch element 56a.

Based on the signal outputted from the feedback circuit 56d, the semiconductor switch element 56a regulates the voltage applied between its gate and its source and thereby regulates the amount of electric current flowing between its drain and its source, so as to cause the sine-wave signal (or predetermined AC signal) commanded by the command signal to be outputted from the battery cell 42. In addition, when there is a deviation between the waveform of the sine-wave signal commanded by the command signal and the waveform of the sine-wave signal actually flowing through the resistor 56b, the semiconductor switch element 56a regulates the amount of electric current based on the signal outputted from the feedback circuit 56d, thereby correcting the deviation. Consequently, the sine-wave signal flowing through the resistor 56b can be stabilized.

Figure 3:
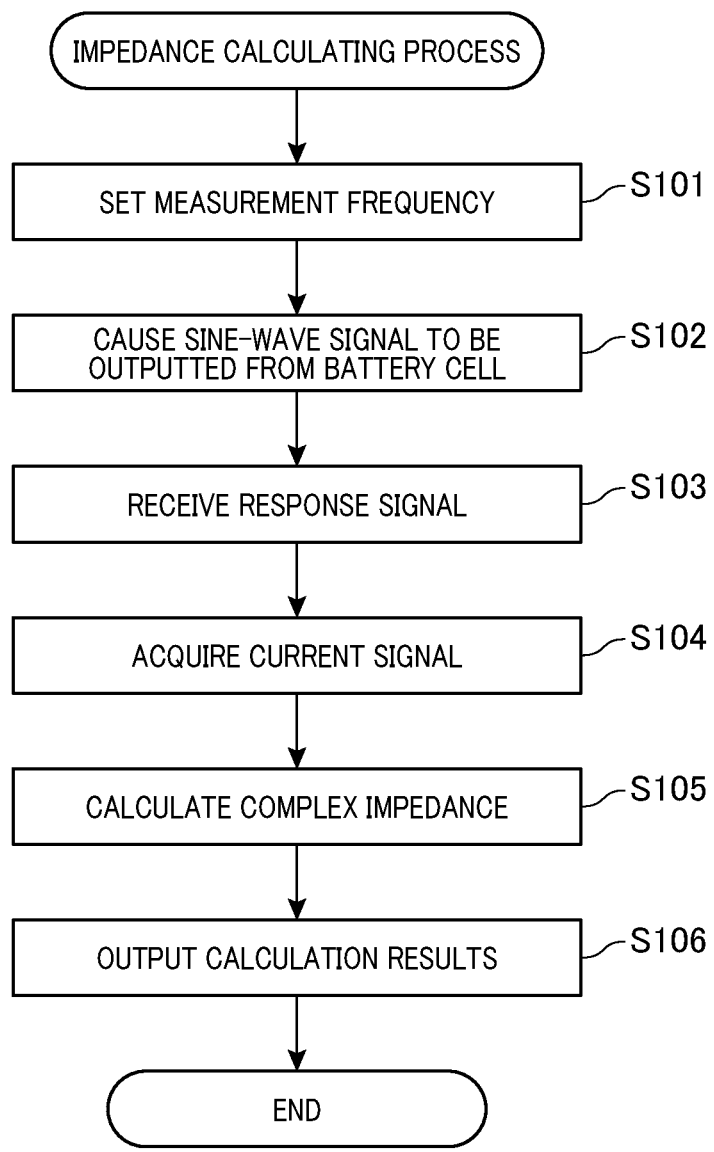
FIG. 3 is a flow chart illustrating a complex impedance calculating process according to the first embodiment.

Next, a process of calculating the complex impedance of each of the battery cells 42 according to the present embodiment will be described with reference to FIG. 3. This process is repeatedly performed by the corresponding battery monitoring apparatus 50 in a predetermined cycle.

In the complex impedance calculating process, first, in step S101, the microcomputer 53 of the corresponding battery monitoring apparatus 50 sets a measurement frequency of the complex impedance within a predetermined frequency range.

In step S102, the microcomputer 53 sets the frequency of the sine-wave signal (or predetermined AC signal) based on the measurement frequency set in step S101. Then, the microcomputer 53 outputs the command signal to the input/output unit 52. As described previously, the command signal is indicative of a command commanding the current modulation circuit 56 to cause the sine-wave signal to be outputted from the battery cell 42.

Upon the command signal being inputted thereto, the input/output unit 52 outputs the command signal, through the digital-to-analog conversion by the DA converter, to the current modulation circuit 56. Then, according to the command signal, the current modulation circuit 56 causes the sine-wave signal to be outputted from the battery cell 42 that is the monitoring target, with the battery cell 42 itself being the electric power source for the output of the sine-wave signal.

More specifically, in the current modulation circuit 56, the semiconductor switch element 56a regulates the amount of electric current based on the signal inputted thereto via the feedback circuit 56d, so as to cause the sine-wave signal commanded by the command signal to be outputted from the battery cell 42. Consequently, the sine-wave signal is outputted from the battery cell 42.

Upon the sine-wave signal being outputted from the battery cell 42, in other words, upon application of a disturbance to the battery cell 42, variation occurs in the voltage between the terminals of the battery cell 42; the voltage variation is indicative of the internal complex impedance information of the battery cell 42. Then, the input/output unit 52 outputs the voltage variation, which is inputted to the input/output unit 52 via the response signal input terminals 58, as the response signal to the microcomputer 53. More specifically, the input/output unit 52 outputs the response signal through the analog-to-digital conversion by the AD converter.

In step S103, the microcomputer 53 receives the response signal outputted from the input/output unit 52.

In step S104, the microcomputer 53 acquires the current signal flowing through the resistor 56b of the current modulation circuit 56 (i.e., the sine-wave signal outputted from the battery cell 42). Specifically, the microcomputer 53 receives, via the input/output unit 52, the feedback signal (or detected signal) outputted from the current detection amplifier 56c as the current signal.

In addition, instead of the feedback signal, a signal which is proportional to the command signal outputted to the current modulation circuit 56 may be used as the current signal.

In step S105, the microcomputer 53 calculates the complex impedance of the battery cell 42 based on both the response signal and the current signal. Specifically, the microcomputer 53 calculates at least one of the real part, the imaginary part, the absolute value and the phase of the complex impedance on the basis of the amplitude of the response signal and the phase difference of the response signal from the current signal.

In step S106, the microcomputer 53 outputs the calculation results to the ECU 60 via the communication unit 54. Then, the complex impedance calculating process terminates.

The above calculating process is repeated until the complex impedance of the battery cell 42 has been calculated with respect to a plurality of measurement frequencies within the predetermined frequency range. Based on the calculation results, the ECU 60 creates, for example, a complex impedance plane plot (or Cole-Cole plot) and thereby determines the characteristics of the electrodes and the electrolyte of the battery cell 42. For example, the ECU 60 determines the SOC and/or SOH of the battery cell 42.

In addition, it is not necessarily needed to create the entire Cole-Cole plot. Instead, it is possible to focus on only part of the Cole-Cole plot. For example, it is possible to: (1) measure the complex impedance of the battery cell 42 at a specific frequency at predetermined time intervals during traveling of the vehicle; and (2) determine changes in the SOC, SOH and temperature of the battery cell 42 during the traveling based on the change with time of the complex impedance at the specific frequency. Alternatively, it is also possible to: (1) measure the complex impedance of the battery cell 42 at a specific frequency at predetermined time intervals (e.g., once every day, every week or every year); and (2) determine the change with time of the SOH of the battery cell 42 based on the change with time of the complex impedance at the specific frequency.

In general, to monitor a state of a battery cell 42, it is necessary to input/output various signals to/from the battery cell 42. Accordingly, it is necessary to join a plurality of electrical paths of signals to each electric power supply terminal 71 of the battery cell 42. Consequently, the time and cost for joining the electrical paths to the electric power supply terminals 71 of the battery cell 42 during the assembly of the battery monitoring apparatus 50 to the battery cell 42 may be increased.

To solve the above problem, in the present embodiment, the battery monitoring apparatuses 50 are configured to reduce the number of electrical paths joined to the electric power supply terminals 71 of each of the battery cells 42.

Figure 4:
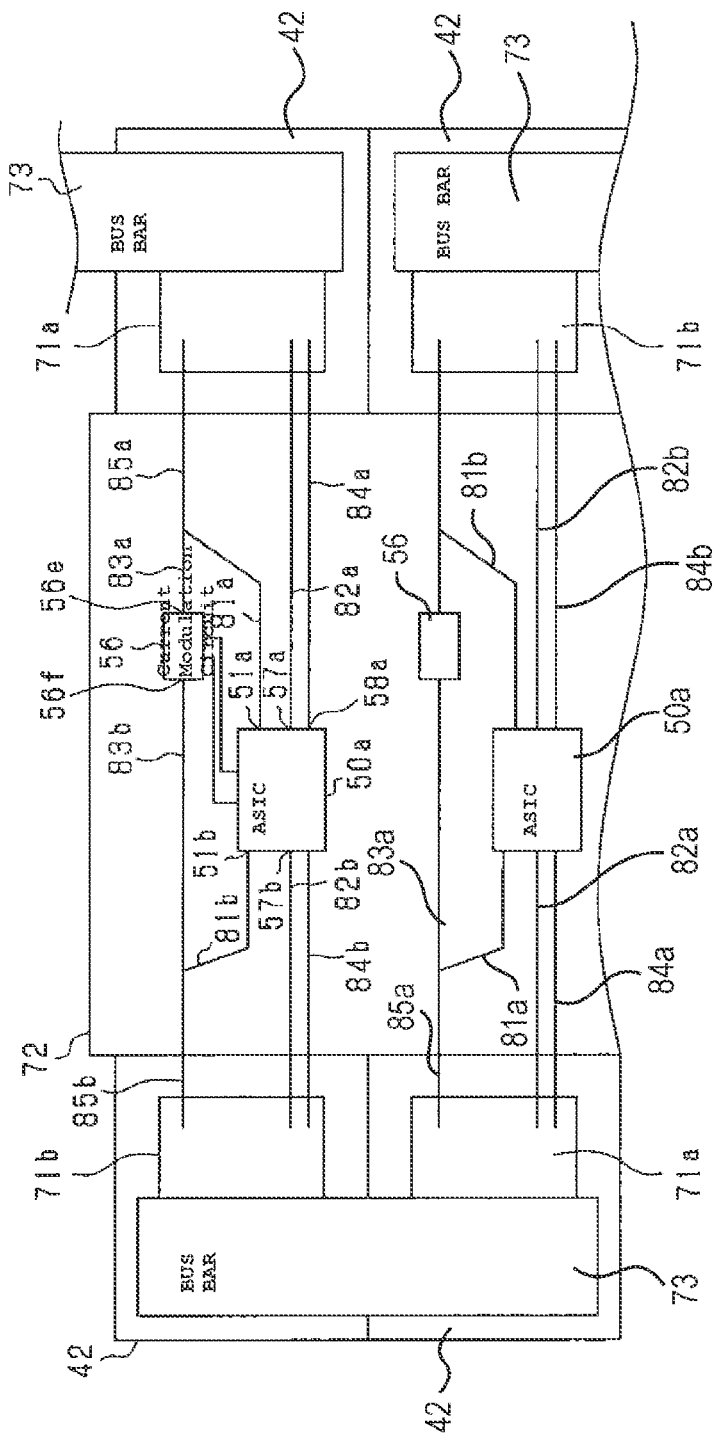
FIG. 4 is a schematic diagram illustrating the electrical connection between a battery cell and the battery monitoring apparatus according to the first embodiment.

FIG. 4 illustrates the electrical connection between each of the battery cells 42 and a corresponding one of the battery monitoring apparatuses 50 according to the present embodiment.

As shown in FIG. 4, each of the battery cells 42 is shaped as a thin rectangular cuboid. Moreover, each of the battery cells 42 has its electric power supply terminals 71 (i.e., the positive-electrode-side and negative-electrode-side electric power supply terminals 71a and 71b) arranged respectively in opposite end portions thereof in its longitudinal direction. The battery cells 42 are stacked in a lateral direction thereof (i.e., the vertical direction in FIG. 4) so as to have their side faces superposed on one another. More specifically, the battery cells 42 are stacked so that for each adjacent pair of the battery cells 42, the positive-electrode-side and negative-electrode-side electric power supply terminals 71a and 71b of one of the pair of the battery cells 42 are aligned in the lateral direction respectively with the negative-electrode-side and positive-electrode-side electric power supply terminals 71b and 71a of the other of the pair of the battery cells 42. Consequently, the positive-electrode-side electric power supply terminals 71a of the battery cells 42 are arranged alternately with the negative-electrode-side electric power supply terminals 71b of the battery cells 42 in the lateral direction.

Moreover, for each of the battery cells 42, the positive-electrode-side electric power supply terminal 71a of the battery cell 42 is connected, via a busbar 73, to the negative-electrode-side electric power supply terminal 71b of that one of the battery cells 42 which is located on one lateral side of and adjacent to the battery cell 42; the negative-electrode-side electric power supply terminal 71b of the battery cell 42 is connected, via a busbar 73, to the positive-electrode-side electric power supply terminal 71a of that one of the battery cells 42 which is located on the other lateral side of and adjacent to the battery cell 42. Consequently, all the battery cells 42 are electrically connected in series with each other via the busbars 73.

Each of the busbars 73 is formed of an electrically conductive material and thin plate-shaped. Moreover, each of the busbars 73 has a length sufficient to connect one adjacent pair of the electric power supply terminals 71 of the battery cells 42 in the lateral direction, for example a length approximately twice the thickness of each of the battery cells 42 in the lateral direction. Furthermore, each of the busbars 73 is joined (e.g., by welding) to one adjacent pair of the electric power supply terminals 71 of the battery cells 42 so as to cover outer end portions (or outer halves) of the pair of the electric power supply terminals 71 in the longitudinal direction of the battery cells 42.

Between the positive-electrode-side electric power supply terminal 71a and negative-electrode-side electric power supply terminal 71b of each of the battery cells 42, there is arranged a flat plate-shaped circuit board 72. The circuit board 72 is implemented by, for example, a PCB (Printed Circuit Board) or FPC (Flexible Printed Circuit). On the circuit board 72, electrical paths (or signal wirings) formed of an electrically conductive metal extend to connect circuit elements arranged on the circuit board 72.

Specifically, the circuit elements arranged (or fixed) on the circuit board 72 include, for example, the ASIC 50a, the filter unit 55 and the current modulation circuit 56 of each of the battery monitoring apparatuses 50. It should be noted that for the sake of simplicity, in FIG. 4, there are illustrated only the ASIC 50a and current modulation circuit 56 of one of the battery monitoring apparatuses 50 in detail.

As shown in FIG. 4, in each of the battery monitoring apparatuses 50, the positive-electrode-side input terminal 57a, which is one of the two DC voltage input terminals 57 of the input/output unit 52 of the ASIC 50a, is connected with a positive-electrode-side second electrical path 82a. On the circuit board 72, the second electrical path 82a is formed to extend straight from the positive-electrode-side input terminal 57a to the positive-electrode-side electric power supply terminal 71a of the corresponding battery cell 42. In addition, a battery-cell-side end portion of the second electrical path 82a is joined, for example by welding, to the positive-electrode-side electric power supply terminal 71a of the corresponding battery cell 42.

On the other hand, the negative-electrode-side input terminal 57b, which is the other of the two DC voltage input terminals 57 of the input/output unit 52 of the ASIC 50a, is connected with a negative-electrode-side second electrical path 82b. On the circuit board 72, the second electrical path 82b is formed to extend straight from the negative-electrode-side input terminal 57b to the negative-electrode-side electric power supply terminal 71b of the corresponding battery cell 42. In addition, a battery-cell-side end portion of the second electrical path 82b is joined, for example by welding, to the negative-electrode-side electric power supply terminal 71b of the corresponding battery cell 42.

That is, in the present embodiment, the two DC voltage input terminals 57 (i.e., 57a and 57b) of the input/output unit 52 of the ASIC 50a are respectively connected to the two electric power supply terminals 71 (i.e., 71a and 71b) of the corresponding battery cell 42 via the two second electrical paths 82 (i.e., 82a and 82b).

Moreover, the positive-electrode-side input terminal 58a, which is one of the two response signal input terminals 58 of the input/output unit 52 of the ASIC 50a, is connected with a positive-electrode-side fourth electrical path 84a. On the circuit board 72, the fourth electrical path 84a is formed to extend straight from the positive-electrode-side input terminal 58a to the positive-electrode-side electric power supply terminal 71a of the corresponding battery cell 42. In addition, a battery-cell-side end portion of the fourth electrical path 84a is joined, for example by welding, to the positive-electrode-side electric power supply terminal 71a of the corresponding battery cell 42.

On the other hand, the negative-electrode-side input terminal 58b, which is the other of the two response signal input terminals 58 of the input/output unit 52 of the ASIC 50a, is connected with a negative-electrode-side fourth electrical path 84b. On the circuit board 72, the fourth electrical path 84b is formed to extend straight from the negative-electrode-side input terminal 58b to the negative-electrode-side electric power supply terminal 71b of the corresponding battery cell 42. In addition, a battery-cell-side end portion of the fourth electrical path 84b is joined, for example by welding, to the negative-electrode-side electric power supply terminal 71b of the corresponding battery cell 42.

That is, in the present embodiment, the two response signal input terminals 58 (i.e., 58a and 58b) of the input/output unit 52 of the ASIC 50a are respectively connected to the two electric power supply terminals 71 (i.e., 71a and 71b) of the corresponding battery cell 42 via the two fourth electrical paths 84 (i.e., 84a and 84b).

Moreover, the positive-electrode-side terminal 51a of the stabilized-electric power supply unit 51 of the ASIC 50a is connected with a positive-electrode-side first electrical path 81a. On the other hand, the negative-electrode-side terminal 51b of the stabilized-electric power supply unit 51 of the ASIC 50a is connected with a negative-electrode-side first electrical path 81b.

That is, in the present embodiment, the two terminals 51a and 51b of the stabilized-electric power supply unit 51 of the ASIC 50a are respectively connected with the two first electrical paths 81 (i.e., 81a and 81b).

Moreover, a positive-electrode-side terminal 56e of the current modulation circuit 56 is connected with a positive-electrode-side third electrical path 83a. In addition, in the current modulation circuit 56, the positive-electrode-side terminal 56e is connected to the drain terminal of the semiconductor switch element 56a (see FIG. 2).

On the other hand, a negative-electrode-side terminal 56f of the current modulation circuit 56 is connected with a negative-electrode-side third electrical path 83b. In addition, in the current modulation circuit 56, the negative-electrode-side terminal 56f is connected to the source terminal of the semiconductor switch element 56a via the resistor 56b (see FIG. 2).

That is, in the present embodiment, the two terminals 56e and 56f of the current modulation circuit 56 are respectively connected with the two third electrical paths 83 (i.e., 83a and 83b).

The first electrical paths 81 are electrical paths (or electric power supply lines) through which drive electric power is supplied from the corresponding battery cell 42 to the battery monitoring apparatus 50. On the other hand, the third electrical paths 83 are electrical paths through which the AC signal flows under constant-current control. The AC signal is considerably weaker than the DC voltage; thus variation in the AC signal hardly affects the drive electric power transmitted through the first electrical paths 81.

In view of the above, in the present embodiment, the first electrical paths 81 are respectively merged with the third electrical paths 83 into fifth electrical paths 85; and the fifth electrical paths 85 are respectively joined to the electric power supply terminals 71 of the corresponding battery cell 42.

More specifically, the positive-electrode-side first electrical path 81a is merged with the positive-electrode-side third electrical path 83a into a positive-electrode-side fifth electrical path 85a; and a battery-cell-side end portion of the fifth electrical path 85a is joined, for example by welding, to the positive-electrode-side electric power supply terminal 71a of the corresponding battery cell 42. On the other hand, the negative-electrode-side first electrical path 81b is merged with the negative-electrode-side third electrical path 83b into a negative-electrode-side fifth electrical path 85b; and a battery-cell-side end portion of the fifth electrical path 85b is joined, for example by welding, to the negative-electrode-side electric power supply terminal 71b of the corresponding battery cell 42.

Moreover, in the present embodiment, the first electrical paths 81 are bent respectively toward the third electrical paths 83, thereby being respectively merged with the third electrical paths 83. That is, each of the third electrical paths 83 and the fifth electrical paths 85 is formed to extend straight. Consequently, the locations at which the electrical paths 82, 84 and 85 are respectively joined to the electric power supply terminals 71 can be made identical for all the battery cells 42.

In addition, in the present embodiment, each of the electrical paths 82, 84 and 85 is directly joined to a corresponding one of the electric power supply terminals 71 without any busbar 73 interposed therebetween. More specifically, each of the electrical paths 82, 84 and 85 has the battery-cell-side end portion thereof joined (e.g., by welding) to an inner end portion (or inner half) of a corresponding one of the electric power supply terminals 71 in the longitudinal direction of the corresponding battery cell 42.

According to the present embodiment, it is possible to achieve the following advantageous effects.

In each of the battery monitoring apparatuses 50 according to the present embodiment, the first electrical paths 81 are respectively merged with the third electrical paths 83 into the fifth electrical paths 85. Consequently, it becomes possible to reduce the number of the electrical paths of the battery monitoring apparatus 50 joined to the electric power supply terminals 71 of the battery cell 42 that is the monitoring target of the battery monitoring apparatus 50. As a result, it becomes possible to reduce the time and cost for joining the electrical paths to the electric power supply terminals 71 during the assembly of the battery monitoring apparatus 50 to the battery cell 42.

In particular, in the present embodiment, the first electrical paths 81, through which drive electric power is supplied from the battery cell 42 to the battery monitoring apparatus 50, are respectively merged with the third electrical paths 83 through which the weak AC signal flows. The current variation due to the AC signal is not so large as to affect the drive electric power; therefore, the current variation does not affect the drive electric power. Moreover, constant-current control is performed for the AC signal; therefore, the AC signal is not affected by transmission of the drive electric power. Accordingly, the merging of the first electrical paths 81 with the third electrical paths 83 does not cause the AC signal and the drive electric power to affect each other.

On the other hand, the second electrical paths 82 are provided separately from the first electrical paths 81 and the third electrical paths 83. Consequently, it becomes possible to prevent the lengths of the second electrical paths 82 from being increased due to the merging thereof with other electrical paths. Thus, it becomes possible to have the DC voltage inputted to the DC voltage input terminals 57 through the second electrical paths 82 without any additional drop in the DC voltage (i.e., any drop in the DC voltage due to an additional resistance component). As a result, it becomes possible for the battery monitoring apparatus 50 to accurately measure the DC voltage. Moreover, the voltage variation of the drive electric power transmitted through the first electrical paths 81 tend to become large. Therefore, with the second electrical paths 82 provided separately from the first electrical paths 81, it becomes possible to ensure the accuracy of measurement of the DC voltage by the battery monitoring apparatus 50.

Moreover, the fourth electrical paths 84 are also provided separately from the first electrical paths 81 and the third electrical paths 83. Consequently, it becomes possible to prevent the lengths of the fourth electrical paths 84 from being increased due to the merging thereof with other electrical paths. Thus, it becomes possible to have the response signal inputted to the response signal input terminals 58 through the fourth electrical paths 84 without passing through any additional impedance component. As a result, it becomes possible to ensure the accuracy of the response signal inputted to the battery monitoring apparatus 50. In particular, the response signal is a very weak signal whereas variation in the drive electric power transmitted through the first electrical paths 81 is large. Therefore, with the fourth electrical paths 84 provided separately from the first electrical paths 81, it becomes possible to ensure the accuracy of measurement of the complex impedance of the battery cell 42 by the battery monitoring apparatus 50.

In the present embodiment, the battery-cell-side end portions of the fourth electrical paths 84 are directly joined to the corresponding electric power supply terminals 71 of the battery cell 42 without any busbar 73 interposed therebetween. Consequently, it becomes possible to have the response signal inputted to the response signal input terminals 58 through the fourth electrical paths 84 without passing through any additional impedance component due to a busbar 73. As a result, it becomes possible to more reliably ensure the accuracy of measurement of the complex impedance of the battery cell 42 by the battery monitoring apparatus 50.

In the present embodiment, the first electrical paths 81 are bent respectively toward the third electrical paths 83, thereby being respectively merged with the third electrical paths 83. With this configuration, the locations at which the electrical paths 82, 84 and 85 are respectively joined to the electric power supply terminals 71 can be made identical for all the battery cells 42. Consequently, it becomes possible to facilitate the process of joining the electrical paths 82, 84 and 85 to the electric power supply terminals 71 during the assembly of the battery monitoring apparatuses 50 to the corresponding battery cells 42.

In the present embodiment, the current modulation circuit 56 is configured to cause the sine-wave signal (or predetermined AC signal) to be outputted from the battery cell 42 that is the monitoring target, with the battery cell 42 itself being the electric power source for the output of the sine-wave signal. Consequently, it becomes unnecessary to employ an external electric power source for applying a disturbance to the battery cell 42 (i.e., causing the sine-wave signal to be outputted from the battery cell 42) for the purpose of measuring the complex impedance of the battery cell 42. As a result, it becomes possible to reduce the parts count and the size of the battery monitoring apparatuses 50, thereby lowering the manufacturing cost.

Moreover, to an in-vehicle storage battery, there are generally connected peripheral devices such as a protective element and a filter circuit. Therefore, when an AC signal is inputted as a disturbance to the storage battery, part of the AC signal may be leaked to the peripheral devices. For example, in the present embodiment, to each of the battery cells 42, there are connected the RC filters 55*a* and the Zener diode 55*b*. Therefore, if an AC signal is inputted to the battery cell 42, part of the AC signal might be leaked to the RC filters 55*a* and the Zener diode 55*b*. Consequently, if the complex impedance of the battery cell 42 was calculated based on a response signal of the battery cell 42 to the inputted AC signal, it might be impossible to ensure the accuracy of calculation of the complex impedance due to an error in the response signal caused by the leakage of the AC signal.

In contrast, in the present embodiment, as described above, the current modulation circuit 56 is configured to cause the sine-wave signal to be outputted from the battery cell 42 that is the monitoring target, with the battery cell 42 itself being the electric power source for the output of the sine-wave signal. Consequently, it becomes possible to realize a closed circuit with the current modulation circuit 56 and the battery cell 42. As a result, it becomes possible to eliminate current leakage from the battery cell 42 to the peripheral devices, thereby suppressing occurrence of an error in the response signal.

Moreover, a deviation may occur between the current signal actually flowing through the resistor 56*b* and the sine-wave signal desired to be outputted from the battery cell 42; this deviation may cause an error in the response signal. In view of the above, in the present embodiment, the current modulation circuit 56 is configured to include the feedback circuit 56*d*. The feedback circuit 56*d* performs, based on comparison between the feedback signal (i.e., the detected signal) and the sine-wave signal commanded by the command signal, a feedback control for the on/off operation of the semiconductor switch element 56*a*. Consequently, it becomes possible to have the commanded (or desired) sine-wave signal stably and accurately outputted from the battery cell 42.

In the present embodiment, in commanding the waveform of the sine-wave signal to the current modulation circuit 56 by the command signal, the digital-to-analog conversion is performed for the command signal. However, an error may occur in the waveform of the command signal during the digital-to-analog conversion. For suppressing occurrence of such an error, a filter circuit may be provided between the input/output unit 52 and the current modulation circuit 56 to smooth the waveform of the command signal. However, in this case, the size and manufacturing cost of the battery monitoring apparatus 50 would be increased.

In particular, the capacity of a vehicular battery cell 42 is generally large. Therefore, the range of measurement frequencies in calculation (or measurement) of the complex impedance of the battery cell 42 tends to become wide. Accordingly, if a filter circuit was provided between the input/output unit 52 and the current modulation circuit 56 to smooth the waveform of the command signal, the size of the filter circuit would also become large.

In contrast, in the present embodiment, as described above, the feedback circuit 56d performs the feedback control for the on/off operation of the semiconductor switch element 56a, thereby suppressing occurrence of an error in the waveform of the command signal. Consequently, it becomes unnecessary to provide a filter circuit between the input/output unit 52 and the current modulation circuit 56.

In the present embodiment, the current modulation circuit 56 is configured to detect the current signal flowing through the resistor 56b and output the detected current signal as the feedback signal to the microcomputer 53 via the input/output unit 52. Then, the microcomputer 53 calculates the complex impedance of the battery cell 42 using the feedback signal as the current signal. Consequently, when there is a deviation (e.g., a phase deviation) between the current signal actually flowing through the resistor 56b and the sine-wave signal desired to be outputted from the battery cell 42 (i.e., the sine-wave signal commanded by the microcomputer 53), it is still possible to ensure the accuracy of calculation of the complex impedance by using the feedback signal (i.e., the current signal actually flowing through the resistor 56b).

Moreover, since the signal correction is performed with the feedback signal as described above, it becomes unnecessary to provide a filter circuit between the input/output unit 52 and the current modulation circuit 56. Consequently, it becomes possible to minimize the size and manufacturing cost of the battery monitoring apparatus 50.

In the present embodiment, the response signal input terminals 58 are connected respectively to, of all connectable portions of the electric power supply terminals 71a and 71b of the battery cell 42, those connectable portions which are located closest to the electrodes of the battery cell 42. Consequently, it becomes possible to suppress the influence of impedance components of the electric power supply terminals 71a and 71b of the battery cell 42 on the response signal inputted to the battery monitoring apparatus 50 via the response signal input terminals 58, thereby improving the accuracy of calculation of the complex impedance of the battery cell 42.

More specifically, as illustrated in FIGS. 5A and 5B, the electric power supply terminals 71a and 71b of the battery cell 42 have impedance components. Therefore, it is preferable for the response signal input terminals 58 to be connected respectively to those connectable portions of the electric power supply terminals 71a and 71b which are located closer to the electrodes as shown in FIG. 5B than those connectable portions which are located further from the electrodes as shown in FIG. 5A. In addition, as shown in FIG. 5B, it is preferable that those connectable portions of the electric power supply terminals 71a and 71b to which the response signal input terminals 58 are respectively connected are located closer to the electrodes than those connectable portions to which the terminals 56e and 56f of the current modulation circuit 56 are respectively connected are.

That is, in the present embodiment, the battery-cell-side end portions of the electrical paths 82, 84 and 85 are respectively joined to different connectable portions of the electric power supply terminals 71a and 71b of the battery cell 42. Moreover, among the different connectable portions of the electric power supply terminals 71a and 71b, the connectable portions to which the battery-cell-side end portions of the fourth electrical paths 84 connected with the response signal input terminals 58 are joined are located closest to the electrodes of the battery cell 42. Consequently, it becomes possible to suppress the influence of the impedance components of the electric power supply terminals 71a and 71b on the response signal inputted to the response signal input terminals 58 through the fourth electrical paths 84, thereby improving the accuracy of calculation of the complex impedance of the battery cell 42.

Second Embodiment

Figure 6:
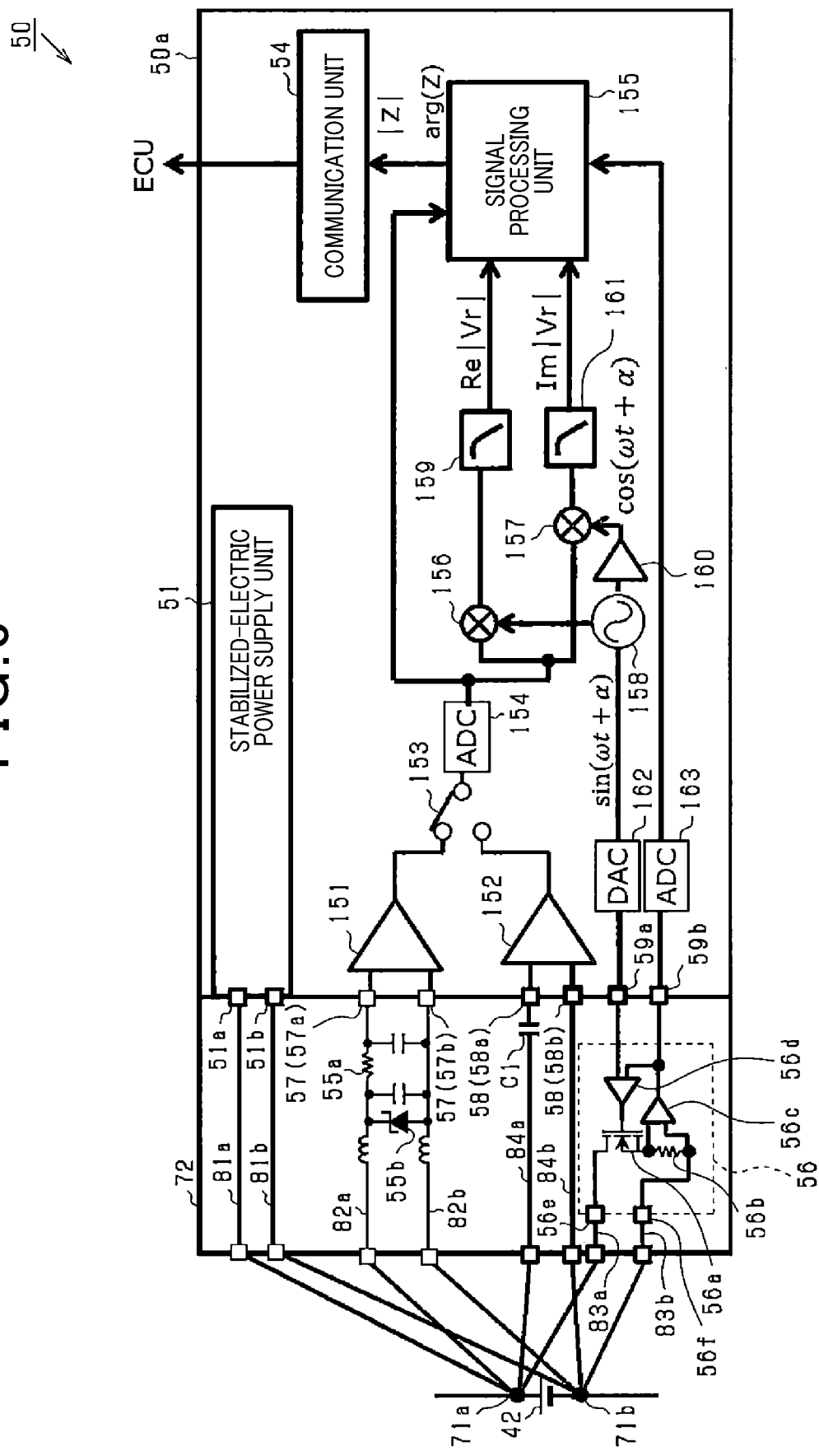
FIG. 6 is a configuration diagram of a battery monitoring apparatus according to a second embodiment.

FIG. 6 shows the configuration of a battery monitoring apparatus 50 according to the second embodiment, which is configured to perform two-phase lock-in detection on the response signal.

As shown in FIG. 6, in the present embodiment, the ASIC 50a of the battery monitoring apparatus 50 includes a differential amplifier 151 provided to measure the DC voltage between the terminals of a battery cell 42 that is the monitoring target. Specifically, the differential amplifier 151 is connected with the DC voltage input terminals 57. Moreover, the differential amplifier 151 is configured to measure the DC voltage inputted thereto via the DC voltage input terminals 57 and output the measured DC voltage.

In the present embodiment, the ASIC 50a also includes a preamplifier 152 provided to input, via the response signal input terminals 58, voltage variation of the battery cell 42 as the response signal during the output of the sine-wave signal. Specifically, the preamplifier 152 is connected with the response signal input terminals 58. Moreover, the preamplifier 152 is configured to amplify the voltage variation inputted thereto via the response signal input terminals 58 and output the amplified voltage variation as the response signal. That is, the amplitude of the response signal is considerably lower than the amplitude of the terminal voltage (i.e., voltage between the terminals) of the battery cell 42; therefore, the preamplifier 152 is employed to improve the accuracy of detecting the response signal.

In addition, in the present embodiment, the preamplifier 152 is implemented by a single-stage amplifier. However, it should be noted that the preamplifier 152 may alternatively be implemented by a multi-stage amplifier.

Moreover, in the present embodiment, as shown in FIG. 6, between the positive-electrode-side electric power supply terminal 71a of the battery cell 42 and the positive-electrode-side input terminal 58a which is one of the two the response signal input terminals 58, there is provided a capacitor C1 to cut off a DC component of the voltage variation of the battery cell 42. Consequently, it becomes possible to remove the DC component, which is irrelevant to the internal complex impedance information of the battery cell 42, from the voltage variation of the battery cell 42, thereby improving the accuracy of detecting the response signal.

In the present embodiment, the ASIC 50a further includes a signal switch 153 to select between the DC voltage outputted from the differential amplifier 151 and the response signal outputted from the preamplifier 152. Moreover, to the signal switch 153, there is connected an AD converter 154 to perform an analog-to-digital conversion for that one of the DC voltage and the response signal which is selected by the signal switch 153.

The AD converter 154 is connected with a signal processing unit 155 that functions as a calculating unit in the second embodiment. The AD converter 154 is configured to input the DC voltage to the signal processing unit 155 when the DC voltage is selected by the signal switch 153. Moreover, the AD converter 154 is also connected with both a first multiplier 156 and a second multiplier 157. The AD converter 154 is configured to input the response signal to each of the first and second multipliers 156 and 157 when the response signal is selected by the signal switch 153.

To the first multiplier 156, there is connected an oscillating circuit 158 which will be described later. A first reference signal is inputted from oscillating circuit 158 to the first multiplier 156. Then, the first multiplier 156 calculates a value proportional to the real part of the response signal by multiplying the first reference signal and the response signal together. Thereafter, the first multiplier 156 outputs the value proportional to the real part of the response signal to the signal processing unit 155 via a low-pass filter 159. In addition, in FIG. 6, the real part of the response signal is denoted by Re|Vr|.

To the second multiplier 157, there is connected the oscillating circuit 158 via a phase-shift circuit 160. A second reference signal is inputted from the phase-shift circuit 160 to the second multiplier 157; the second reference signal is produced by the phase-shift circuit 160 by advancing the phase of the first reference signal by 90° (i.e., π/2). More specifically, the phase-shift circuit 160 is configured to advance the phase of a sine-wave signal (i.e., the first reference signal) inputted thereto from the oscillating circuit 158 and output the phase-advanced sine-wave signal as the second reference signal to the second multiplier 157.

The second multiplier 157 calculates a value proportional to the imaginary part of the response signal by multiplying the second reference signal and the response signal together. Then, the second multiplier 157 outputs the value proportional to the imaginary part of the response signal to the signal processing unit 155 via a low-pass filter 161. In addition, in FIG. 6, the imaginary part of the response signal is denoted by Im|Vr|.

The oscillating circuit 158 is configured to output the predetermined sine-wave single and functions as a waveform commanding unit. As described above, the oscillating circuit 158 outputs the sine-wave signal as the first reference signal to both the first multiplier 156 and the phase-shift circuit 160. Moreover, the oscillating circuit 158 is connected with the command signal output terminal 59a via a DA converter 162. The oscillating circuit 158 outputs the sine-wave signal as the command signal to the command signal output terminal 59a through the digital-to-analog conversion by the DA converter 162.

The feedback signal input terminal 59b is connected with the signal processing unit 155 via an AD converter 163. The feedback signal (or detected signal) is inputted from the feedback signal input terminal 59b to the signal processing unit 155 through the analog-to-digital conversion by the AD converter 163.

The signal processing unit 155 receives both the value proportional to the real part of the response signal and the value proportional to the imaginary part of the response signal. Then, based on these values, the signal processing unit 155 calculates both the real and imaginary parts of the complex impedance of the battery cell 42. Moreover, based on the feedback signal inputted thereto, the signal processing unit 155 corrects both the real and imaginary parts of the complex impedance taking into account the amplitude of the current signal actually flowing through the resistor 56b and the phase difference of the current signal from the sine-wave signal commanded by the command signal.

Furthermore, the signal processing unit 155 also calculates both the absolute value and the phase of the complex impedance. More specifically, since both the real part and the imaginary part of the response signal have been detected by the two-phase lock-in detection, the response signal can be represented by $|Vr|e^{j\theta v}$ in polar coordinates on a complex plane, where θv is the phase of the response signal. Similarly, the current can be represented by $|I|e^{j\theta i}$ in polar coordinates on the complex plane, where θi is the phase of the current. Moreover, the complex impedance of the battery cell 42 can be represented by $|Z|e^{j\theta z}$ in polar coordinates on the complex plane, where θz is the phase of the complex impedance. Then, the following equation (1) can be derived from V=ZI. In addition, "j" is the imaginary unit satisfying (j^2=−1).

$$|Z|e^{j\theta z} = \frac{|Vr|e^{j\theta v}}{|I|e^{j\theta i}} \quad (1)$$

The signal processing unit 155 calculates the absolute value of the complex impedance by (|Z|=|Vr|/|I|). Moreover, the signal processing unit 155 calculates the phase of the complex impedance by (θv−θi). Thereafter, the signal processing unit 155 outputs the calculation results to the ECU 60 via the communication unit 54. In addition, in FIG. 6, the absolute value and the phase of the complex impedance are respectively denoted by |Z| and arg(Z).

Figure 7:
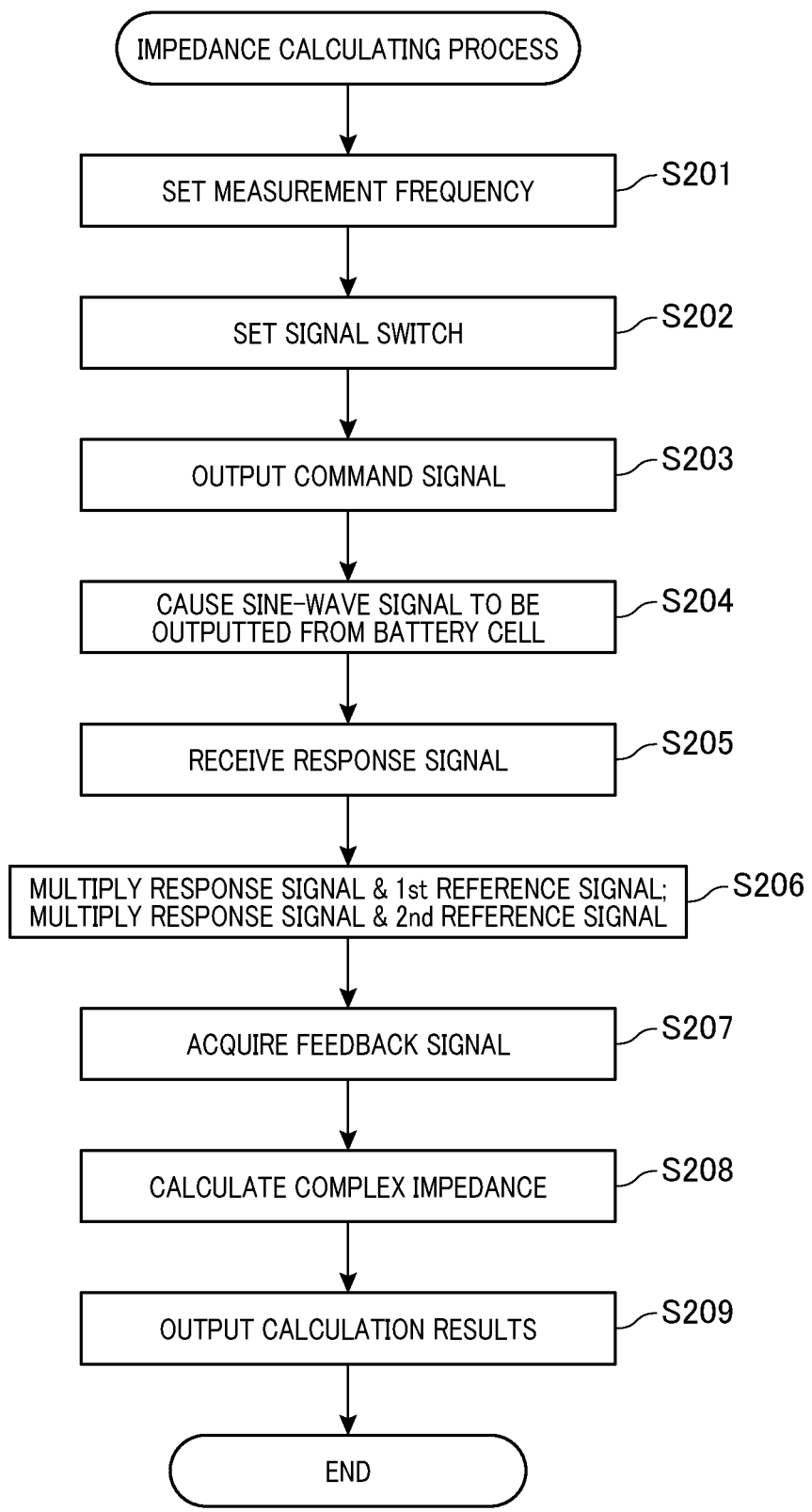
FIG. 7 is a flow chart illustrating a complex impedance calculating process according to the second embodiment.

Next, a process of calculating the complex impedance of a battery cell 42 according to the second embodiment will be described with reference to FIG. 7. This process is repeatedly performed by the battery monitoring apparatus 50 in a predetermined cycle.

In the complex impedance calculating process, first, in step S201, the oscillating circuit 158 sets a measurement frequency of the complex impedance within a predetermined frequency range. In addition, in the second embodiment, the measurement frequency is determined by, for example, the signal processing unit 155.

In step S202, the signal switch 153 is set to allow, of the DC voltage outputted from the differential amplifier 151 and the response signal outputted from the preamplifier 152, only the response signal to be outputted to the AD converter 154. In addition, the signal switch 153 is operated according to, for example, a command from the signal processing unit 155.

In step S203, the oscillating circuit 158 sets the frequency of the sine-wave signal (or predetermined AC signal) based on the measurement frequency set in step S201. Then, the oscillating circuit 158 outputs the command signal, through the digital-to-analog conversion by the DA converter 162, to the current modulation circuit 56 via the command signal output terminal 59a. As described previously, the command signal is indicative of a command commanding the current modulation circuit 56 to cause the sine-wave signal to be outputted from the battery cell 42. In addition, the oscillating circuit 158 outputs the command signal according to, for example, a command from the signal processing unit 155.

In the digital-to-analog conversion of the command signal by the DA converter 162, a suitable offset value (i.e., DC bias) is set taking into account the DC voltage of the battery cell 42. More specifically, the offset value is set by, for example, the signal processing unit 155. Moreover, it is desirable for the offset value to be set based on the DC voltage of the battery cell 42. In addition, the DC voltage of the battery cell 42 may be measured by the differential amplifier 151.

In step S204, according to the command signal, the current modulation circuit 56 causes the sine-wave signal to be outputted from the battery cell 42 that is the monitoring target, with the battery cell 42 itself being the electric power source for the output of the sine-wave signal. Consequently, the sine-wave signal is outputted from the battery cell 42.

Upon the sine-wave signal being outputted from the battery cell 42, in other words, upon application of a disturbance to the battery cell 42, variation occurs in the voltage between the terminals of the battery cell 42; the voltage variation is indicative of the internal complex impedance information of the battery cell 42. Then, the preamplifier 152 outputs, as the response signal, the voltage variation which is inputted to the preamplifier 152 via the response signal input terminals 58.

In addition, during the input of the voltage variation from the battery cell 42 to the response signal input terminals 58, the DC component of the voltage variation is cut off (or removed) by the capacitor C1, leaving only the characterizing part of the voltage variation. It is desirable for the size of the DC component cut off by the capacitor C1 to be adjusted based on the DC voltage of the battery cell 42. The preamplifier 152 amplifies the weak voltage variation from which the DC component has been removed, and outputs the amplified voltage variation as the response signal. It is desirable for the degree of amplification of the voltage variation by the preamplifier 152 to be adjusted based on the DC voltage of the battery cell 42.

The AD converter 154 performs the analog-to-digital conversion on the response signal which is inputted to the AD converter 154 via the signal switch 153. Then, the AD converter 154 outputs the response signal in a digital form to each of the first and second multipliers 156 and 157.

In step S205, each of the first and second multipliers 156 and 157 receives the response signal outputted from the AD converter 154.

In step S206, the first multiplier 156 calculates a value proportional to the real part of the response signal by multiplying the first reference signal (i.e., the sine-wave signal from the oscillating circuit 158) and the response signal together. At the same time, the second multiplier 157 calculates a value proportional to the imaginary part of the response signal by multiplying the second reference signal (i.e., the phase-advanced sine-wave signal from the phase-shift circuit 160) and the response signal together.

Then, the values calculated by the first and second multipliers 156 and 157 are inputted to the signal processing unit 155 respectively through the low-pass filters 159 and 161. In addition, when passing through the low-pass filters 159 and 161, signal components other than DC components are attenuated (or removed).

In step S207, the signal processing unit 155 acquires the feedback signal (or detected signal) from the feedback signal input terminal 59b. More specifically, the feedback signal is inputted from the feedback signal input terminal 59b to the signal processing unit 155 through the analog-to-digital conversion by the AD converter 163.

In step S208, the signal processing unit 155 calculates, based on the feedback signal and the signals (or values respectively proportional to the real and imaginary parts of the response signal) from the low-pass filters 159 and 161, at least one of the real part, the imaginary part, the absolute value and the phase of the complex impedance of the battery cell 42. In addition, the feedback signal is used to correct (or eliminate) any deviation in amplitude or phase between the current signal actually outputted from the battery cell 42 and the sine-wave signal desired to be outputted from the battery cell 42.

In step S209, the signal processing unit 155 outputs the calculation results to the ECU 60 via the communication unit 54. Then, the complex impedance calculating process terminates.

The above calculating process is repeated until the complex impedance of the battery cell 42 has been calculated with respect to a plurality of measurement frequencies within the predetermined frequency range. Based on the calculation results, the ECU 60 creates, for example, a complex impedance plane plot (or Cole-Cole plot) and thereby determines the characteristics of the electrodes and the electrolyte of the battery cell 42. For example, the ECU 60 determines the SOC and/or SOH of the battery cell 42.

In addition, it is not necessarily needed to create the entire Cole-Cole plot. Instead, it is possible to focus on only part of the Cole-Cole plot. For example, it is possible to: (1) measure the complex impedance of the battery cell 42 at a specific frequency at predetermined time intervals during traveling of the vehicle; and (2) determine changes in the SOC, SOH and temperature of the battery cell 42 during the traveling based on the change with time of the complex impedance at the specific frequency. Alternatively, it is also possible to: (1) measure the complex impedance of the battery cell 42 at a specific frequency at predetermined time intervals (e.g., once every day, every week or every year); and (2) determine the change with time of the SOH of the battery cell 42 based on the change with time of the complex impedance at the specific frequency.

In addition, in the second embodiment, the battery cell 42 and the battery monitoring apparatus 50 are connected in the same manner as in the first embodiment. Moreover, the electrical paths 81-85 are formed on the circuit board 72 in the same manner as in the first embodiment. Therefore, descriptions of the connection between the battery cell 42 and the battery monitoring apparatus 50 and the formation of the electrical paths 81-85 on the circuit board 72 are not repeated hereinafter.

According to the second embodiment, it is possible to achieve the following advantageous effects.

In the battery monitoring apparatus 50 according to the present embodiment, the signal processing unit 155 calculates a value proportional to the real part of the response signal based on the product of the response signal inputted via the response signal input terminals 58 and the first reference signal together. Moreover, the signal processing unit 155 also calculates a value proportional to the imaginary part of the response signal based on the product of the response signal and the second reference signal that is produced by shifting the phase of the sine-wave signal (i.e., the first reference signal). Then, the signal processing unit 155 calculates the complex impedance of the battery cell 42 based on the above values. Consequently, by performing the so-called lock-in detection, it becomes possible to extract, from the response signal, only a component having the same frequency as the sine-wave signal commanded by the oscillating circuit 158. Therefore, the battery monitoring apparatus 50 according to the present embodiment is tolerant to white noise and pink noise and capable of accurately calculating the complex impedance of the battery cell 42. Accordingly, the battery monitoring apparatus 50 according to the present embodiment is particularly suitable for use in a vehicle where there are generally present various types of noise. Moreover, since the battery monitoring apparatus 50 is tolerant to noise, it becomes possible to lower the current (i.e., the sine-wave signal) caused to be outputted from the battery cell 42. Consequently, it becomes possible to suppress consumption of the electric power of the battery cell 42; it also becomes possible to suppress increase in the temperatures of the battery cell 42 and the semiconductor switch element 56a of the battery monitoring apparatus 50.

Moreover, in the present embodiment, the signal processing unit 155 acquires, from the current modulation circuit 56, the feedback signal that is the detected current signal actually outputted from (or actually flowing out of) the battery cell 42. Then, the signal processing unit 155 corrects (or eliminates) any deviation in amplitude or phase between the current signal actually outputted from the battery cell 42 and the sine-wave signal commanded by the command signal. Consequently, it becomes possible to improve the accuracy of calculation of the complex impedance of the battery cell 42.

Furthermore, in the present embodiment, even if an error occurs in the waveform of the command signal during the digital-to-analog conversion by the DA converter 162, it is possible to suppress the error by the correction performed using the feedback signal. Consequently, it becomes unnecessary to provide a filter circuit between the current modulation circuit 56 and the DA converter 162. As a result, it becomes possible to minimize the size and manufacturing cost of the battery monitoring apparatus 50.

Third Embodiment

Figure 8:
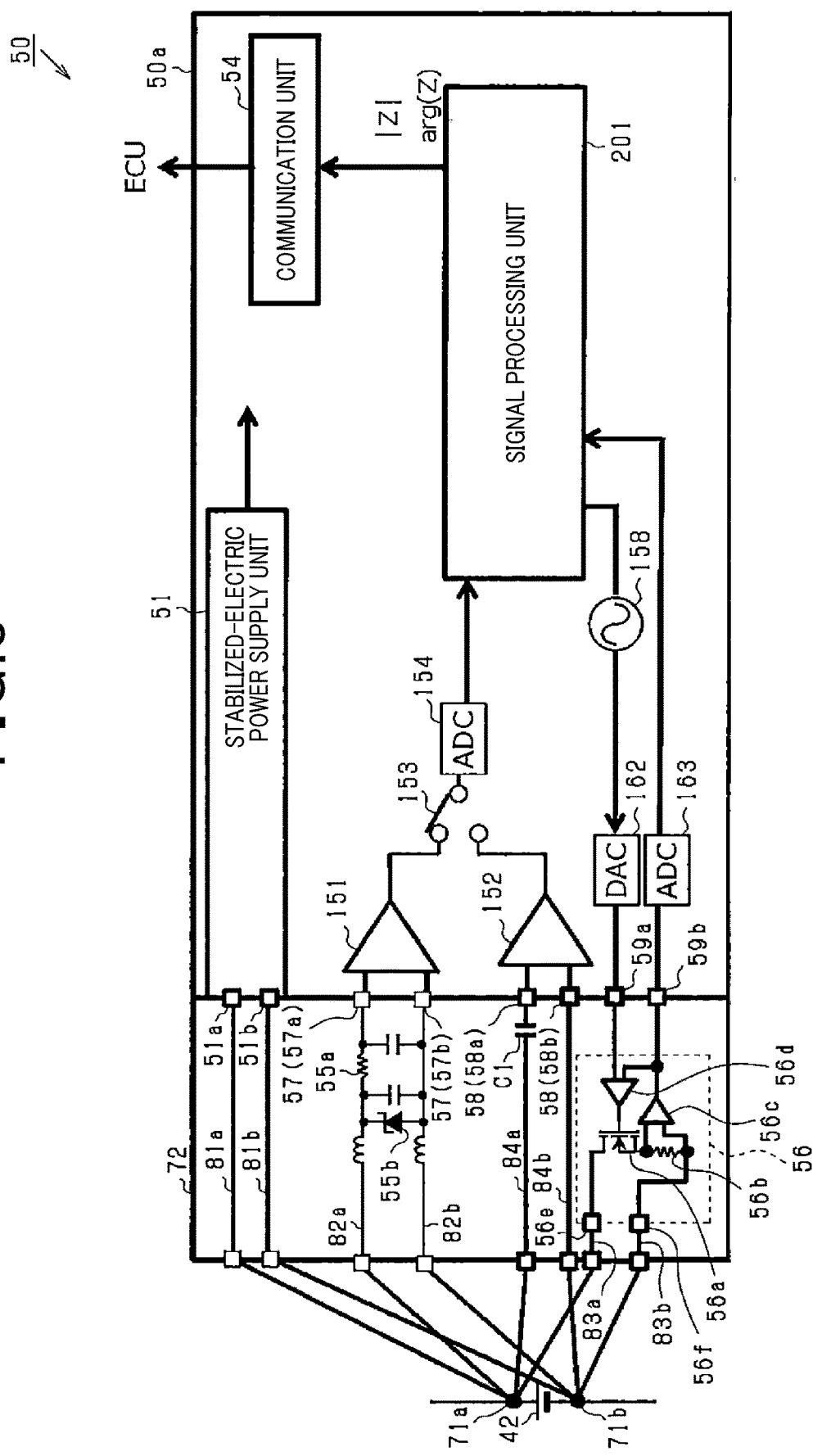
FIG. 8 is a configuration diagram of a battery monitoring apparatus according to a third embodiment.

FIG. 8 shows the configuration of a battery monitoring apparatus 50 according to the third embodiment, which is configured to perform a FFT (Fast Fourier Transform) in signal analyses.

As shown in FIG. 8, in the present embodiment, the ASIC 50a of the battery monitoring apparatus 50 includes a signal processing unit 201 that functions as a calculating unit to perform the FFT. The signal processing unit 201 is configured to receive the measurement value of the DC voltage of the battery cell 42 via the AD converter 154. Moreover, the signal processing unit 201 is also configured to receive the response signal via the AD converter 154. Furthermore, the signal processing unit 201 is also configured to receive the feedback signal via the AD converter 163. In addition, the signal processing unit 201 is connected with the oscillating circuit 158 and configured to be capable of setting the frequency of the sine-wave signal.

In the present embodiment, the signal processing unit 201 performs the FFT on each of the response signal (i.e., voltage signal) and the feedback signal (i.e., current signal). Then, the signal processing unit 201 calculates the real part, the imaginary part, the absolute value and the phase of the complex impedance of the battery cell 42 on the basis of the results of performing the FFT on the response signal and the feedback signal. Thereafter, the signal processing unit 201 outputs the calculation results to the ECU 60 via the communication unit 54.

Figure 9:
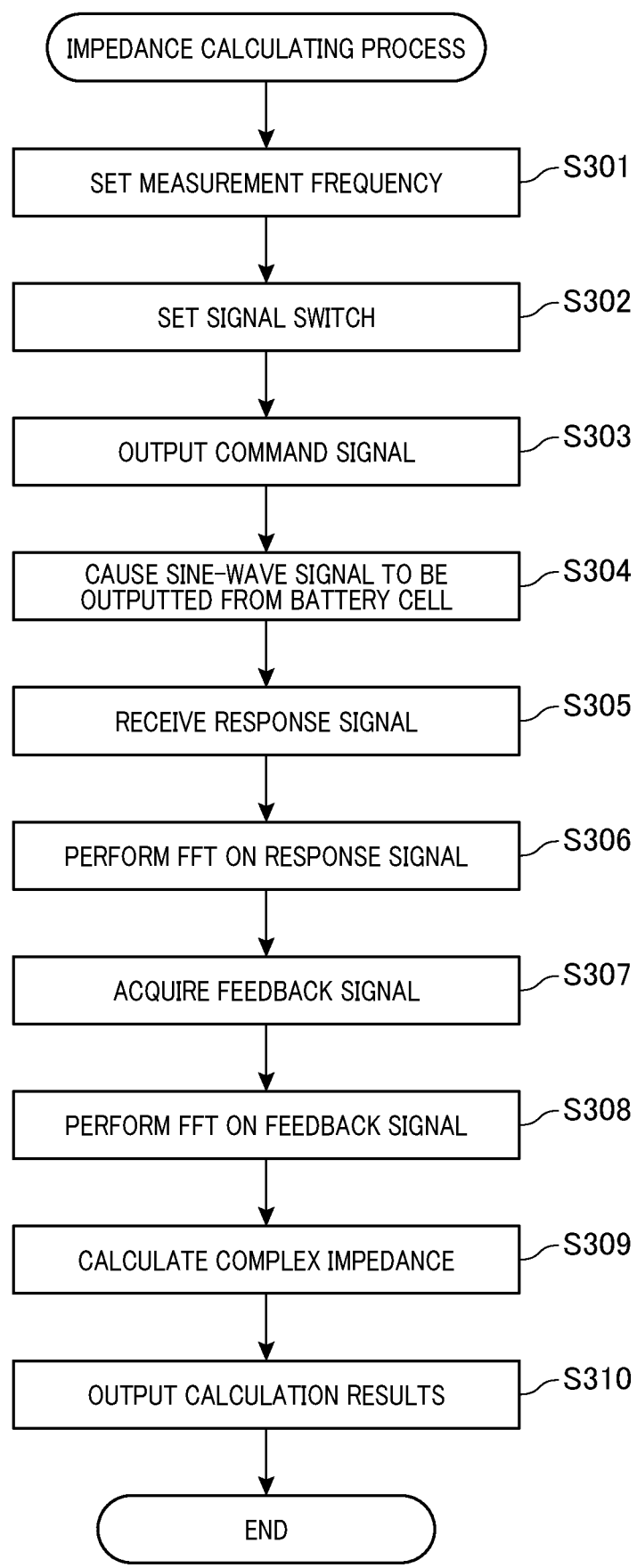
FIG. 9 is a flow chart illustrating a complex impedance calculating process according to the third embodiment.

Next, a process of calculating the complex impedance of a battery cell 42 according to the third embodiment will be described with reference to FIG. 9. This process is repeatedly performed by the battery monitoring apparatus 50 in a predetermined cycle.

Steps S301-S305 of the complex impedance calculating process according to the third embodiment are respectively identical to steps S201-S205 of the complex impedance calculating process according to the second embodiment. Therefore, descriptions of steps S301-S305 of the complex impedance calculating process according to the third embodiment are omitted hereinafter.

In addition, in the third embodiment, the measurement frequency and the offset value (i.e., DC bias) are set by the signal processing unit 201. Moreover, operation of the signal switch 153 and output of the command signal are commanded (or controlled) by the signal processing unit 201.

In step S306 of the complex impedance calculating process according to the third embodiment, the signal processing unit 201 performs the FFT on the response signal received from the AD converter 154. Consequently, information on the amplitude of the response signal with respect to the measurement frequency is obtained.

In step S307, the signal processing unit 201 acquires the feedback signal from the feedback signal input terminal 59b. More specifically, the feedback signal is inputted from the feedback signal input terminal 59b to the signal processing unit 201 through the analog-to-digital conversion by the AD converter 163.

In step S308, the signal processing unit 201 performs the FFT on the feedback signal. Consequently, information on the amplitude of the feedback signal with respect to the measurement frequency is obtained.

In step S309, the signal processing unit 201 calculates, based on both the amplitude information of the response signal obtained in step S306 and the amplitude information of the feedback signal obtained in step S308, at least one of the real part, the imaginary part, the absolute value and the phase of the complex impedance of the battery cell 42.

In step S310, the signal processing unit 201 outputs the calculation results to the ECU 60 via the communication unit 54. Then, the complex impedance calculating process terminates.

The above calculating process is repeated until the complex impedance of the battery cell 42 has been calculated with respect to a plurality of measurement frequencies within the predetermined frequency range. Based on the calculation results, the ECU 60 creates, for example, a complex impedance plane plot (or Cole-Cole plot) and thereby determines the characteristics of the electrodes and the electrolyte of the battery cell 42. For example, the ECU 60 determines the SOC and/or SOH of the battery cell 42.

In addition, it is not necessarily needed to create the entire Cole-Cole plot. Instead, it is possible to focus on only part of the Cole-Cole plot. For example, it is possible to: (1) measure the complex impedance of the battery cell 42 at a specific frequency at predetermined time intervals during traveling of the vehicle; and (2) determine changes in the SOC, SOH and temperature of the battery cell 42 during the traveling based on the change with time of the complex impedance at the specific frequency. Alternatively, it is also possible to: (1) measure the complex impedance of the battery cell 42 at a specific frequency at predetermined time intervals (e.g., once every day, every week or every year); and (2) determine the change with time of the SOH of the battery cell 42 based on the change with time of the complex impedance at the specific frequency.

In addition, in the third embodiment, the battery cell 42 and the battery monitoring apparatus 50 are connected in the same manner as in the first embodiment. Moreover, the electrical paths 81-85 are formed on the circuit board 72 in the same manner as in the first embodiment. Therefore, descriptions of the connection between the battery cell 42 and the battery monitoring apparatus 50 and the formation of the electrical paths 81-85 on the circuit board 72 are not repeated hereinafter.

According to the third embodiment, it is possible to achieve the following advantageous effects.

In the battery monitoring apparatus 50 according to the present embodiment, the signal processing unit 201 performs the FFT on each of the response signal and the feedback signal, thereby obtaining not only the amplitude information and phase information of both the response and feedback signals (i.e., voltage and current signals) with respect to the measurement frequency but also the amplitude information and phase information of both the response and feedback signals with respect to harmonics of the measurement frequency. Consequently, it becomes possible to calculate the complex impedance of the battery cell 42 with respect to a plurality of frequencies at one time.

Moreover, in the present embodiment, the signal processing unit 201 acquires, from the current modulation circuit 56, the feedback signal that is the detected current signal actually outputted from (or actually flowing out of) the battery cell 42. Then, the signal processing unit 201 performs the FFT on the feedback signal. Consequently, it becomes possible to correct (or eliminate) any deviation in amplitude or phase between the current signal actually outputted from the battery cell 42 and the sine-wave signal commanded by the command signal. As a result, it becomes possible to improve the accuracy of calculation of the complex impedance of the battery cell 42.

Fourth Embodiment

As described above, in the first embodiment, each battery monitoring apparatus 50 is configured to monitor one battery cell 42. Alternatively, each battery monitoring apparatus 50 may be configured to monitor a plurality of battery cells 42 (e.g., all the battery cells 42 of one battery module 41 or all the battery cells 42 of the entire battery pack 40). Moreover, some functions of the battery monitoring apparatus 50 may be shared by all the battery cells 42.

Figure 10:
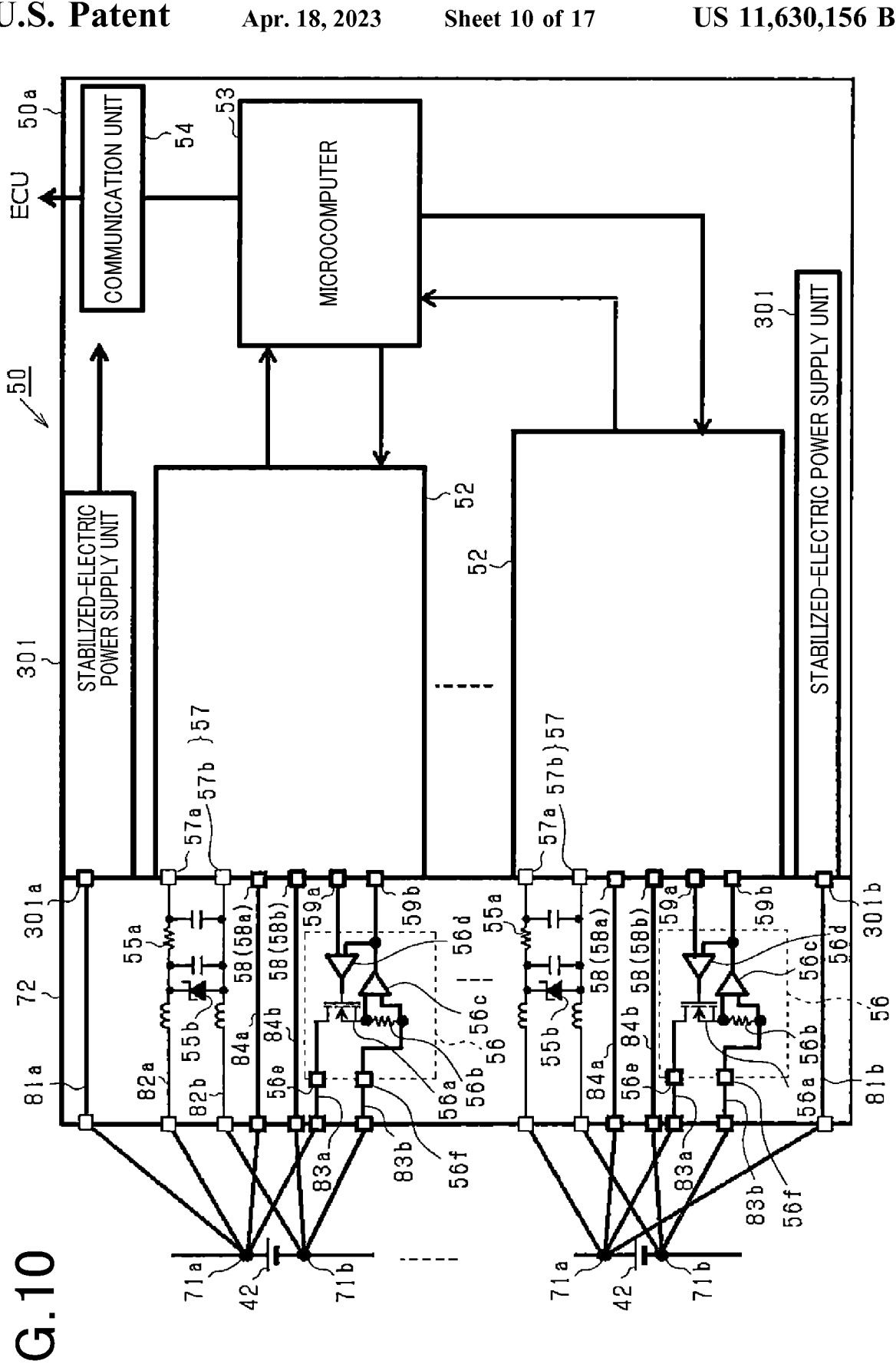
FIG. 10 is a configuration diagram of a battery monitoring apparatus according to a fourth embodiment.

FIG. 10 shows the configuration of a battery monitoring apparatus 50 according to the fourth embodiment.

As shown in FIG. 10, in the present embodiment, the stabilized-electric power supply unit 301, the communication unit 54 and the microcomputer 53 of the battery monitoring apparatus 50 are shared by all the battery cells 42 of the battery pack 40 (or of one battery module 41).

Moreover, the electric potentials of the negative electrodes of the battery cells 42 are different from each other. Accordingly, the reference electric potentials of the battery cells 42 for various electrical signals used to communicate various types of information are also different from each other. Therefore, it is necessary to have the various electrical signals from the battery cells 42 inputted to the microcomputer 53 and processed by the microcomputer 53 taking into account the differences between the reference electric potentials. In addition, as means for communicating signals between different reference electric potentials, a capacitor, a transformer, a radio wave and/or light may be employed.

In the present embodiment, as shown in FIG. 10, the stabilized-electric power supply unit 301 is configured to be supplied with the terminal voltage (or voltage between the terminals) of the battery pack 40 (or one battery module 41). That is, the stabilized-electric power supply unit 301 is connected with: (1) the positive-electrode-side electric power supply terminal 71a of that one of all the battery cells 42 of the battery pack 40 (or of one battery module 41) which has the highest electric potential in the battery pack 40 (or in the battery module 41); and (2) the negative-electrode-side electric power supply terminal 71b of that one of all the battery cells 42 of the battery pack 40 (or of one battery module 41) which has the lowest electric potential in the battery pack 40 (or in the battery module 41).

Accordingly, in the present embodiment, of all the battery cells 42 of the battery pack 40 (or of one battery module 41), only the two battery cells 42 arranged respectively at opposite ends of the battery pack 40 (or the battery module 41) in the series connection direction (or stacking direction) of the battery cells 42 have electrical paths formed to be different from the electrical paths of the other battery cells 42.

Figure 11:
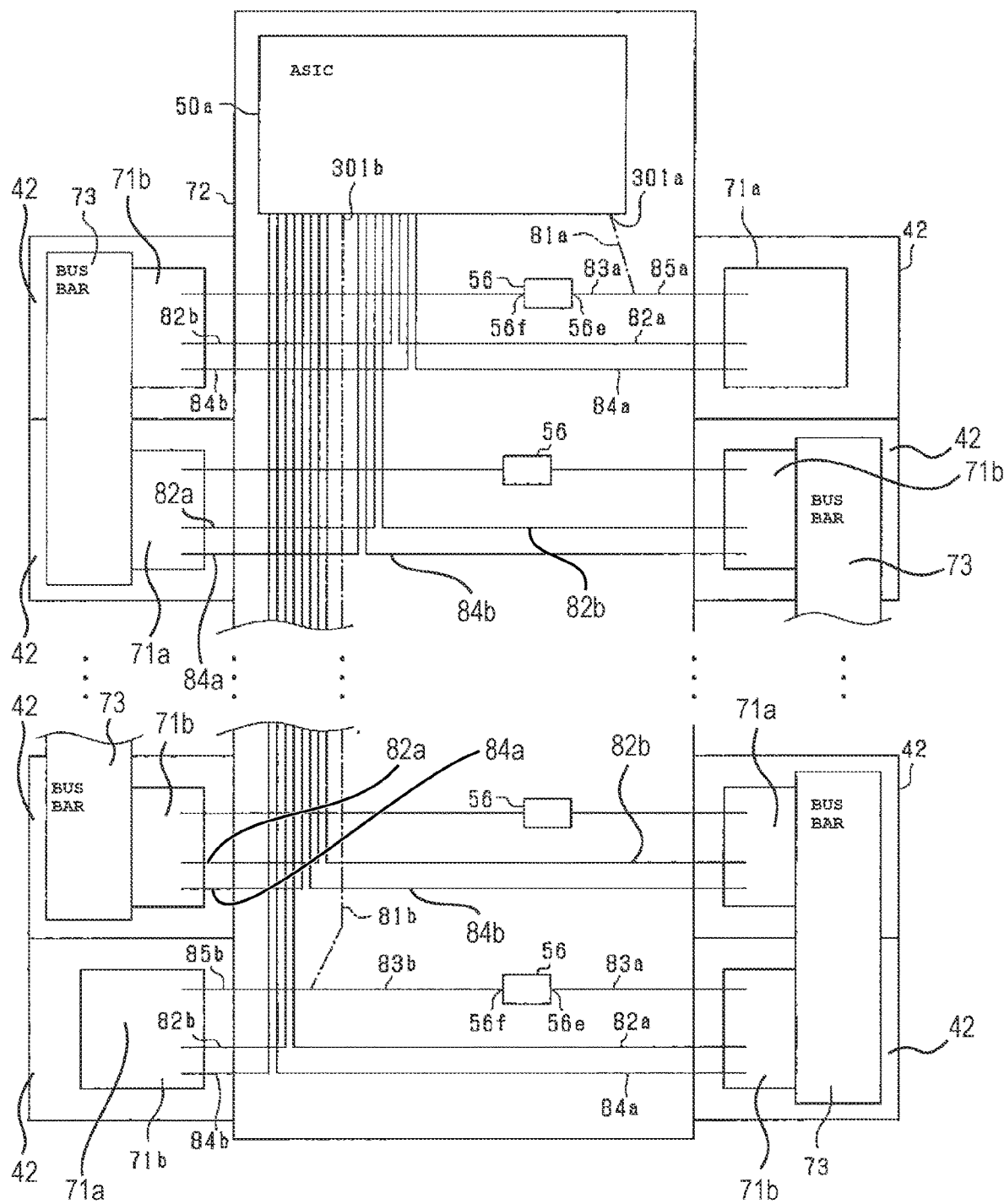
FIG. 11 is a schematic diagram illustrating the electrical connection between battery cells and the battery monitoring apparatus according to the fourth embodiment.

Specifically, as shown in FIG. 11, to the positive-electrode-side electric power supply terminal 71a of the battery cell 42 arranged at the higher-potential-side end (i.e., the upper end in FIG. 11) of the battery pack 40 in the series connection direction, there is connected a positive-electrode-side fifth electrical path 85a. The positive-electrode-side fifth electrical path 85a is branched into a positive-electrode-side first electrical path 81a and a positive-electrode-side third electrical path 83a. The positive-electrode-side first electrical path 81a, which is shown with a one-dot chain line in FIG. 11, is connected with a positive-electrode-side terminal 301a of the stabilized-electric power supply unit 301. The positive-electrode-side third electrical path 83a is connected with the positive-electrode-side terminal 56e of the current modulation circuit 56 corresponding to the battery cell 42 arranged at the higher-potential-side end of the battery pack 40.

Moreover, no negative-electrode-side fifth electrical path 85b is connected to the negative-electrode-side electric power supply terminal 71b of the battery cell 42 arranged at the higher-potential-side end of the battery pack 40. Instead, the negative-electrode-side terminal 56f of the current modulation circuit 56 corresponding to the battery cell 42 is connected to the negative-electrode-side electric power supply terminal 71b of the battery cell 42 via the negative-electrode-side third electrical path 83b. In addition, the second electrical paths 82 corresponding to the battery cell 42 are connected to the ASIC 50a separately from the fourth electrical paths 84 corresponding to the battery cell 42.

On the other hand, to the negative-electrode-side electric power supply terminal 71b of the battery cell 42 arranged at the lower-potential-side end (i.e., the lower end in FIG. 11) of the battery pack 40 in the series connection direction, there is connected a negative-electrode-side fifth electrical path 85b. The negative-electrode-side fifth electrical path 85b is branched into a negative-electrode-side first electrical path 81b and a negative-electrode-side third electrical path 83b. The negative-electrode-side first electrical path 81b, which is shown with a one-dot chain line in FIG. 11, is connected with a negative-electrode-side terminal 301b of the stabilized-electric power supply unit 301. The negative-electrode-side third electrical path 83b is connected with the negative-electrode-side terminal 56f of the current modulation circuit 56 corresponding to the battery cell 42 arranged at the lower-potential-side end of the battery pack 40.

Moreover, no positive-electrode-side fifth electrical path 85a is connected to the positive-electrode-side electric power supply terminal 71a of the battery cell 42 arranged at the lower-potential-side end of the battery pack 40. Instead, the positive-electrode-side terminal 56e of the current modulation circuit 56 corresponding to the battery cell 42 is connected to the positive-electrode-side electric power supply terminal 71a of the battery cell 42 via the positive-electrode-side third electrical path 83a. In addition, the second electrical paths 82 corresponding to the battery cell 42 are connected to the ASIC 50a separately from the fourth electrical paths 84 corresponding to the battery cell 42.

Each of the battery cells 42 other than those arranged at the ends of the battery pack 40 has no fifth electrical paths 85 and thus no first electrical paths 81 connected to the electric power supply terminals 71 thereof. Instead, each of the battery cells 42 other than those arranged at the ends of the battery pack 40 has: a positive-electrode-side third electrical path 83*a* connected with the positive-electrode-side electric power supply terminal 71*a* thereof; and a negative-electrode-side third electrical path 83*b* connected with the negative-electrode-side electric power supply terminal 71*b* thereof. In addition, the second electrical paths 82 corresponding to the battery cells 42 are connected to the ASIC 50*a* separately from the fourth electrical paths 84 corresponding to the battery cells 42.

As above, in the present embodiment, each of the electric power supply terminals 71 of the battery cells 42 has only three electrical paths joined thereto. Moreover, the first electrical paths 81 are bent respectively toward the third electrical paths 83, thereby being respectively merged with the third electrical paths 83. Consequently, the locations at which the electrical paths are respectively joined to the electric power supply terminals 71 can be made identical for all the battery cells 42. As a result, it becomes possible to facilitate the process of joining the electrical paths to the electric power supply terminals 71 during the assembly of the battery monitoring apparatus 50 to the battery cells 42.

Fifth Embodiment

As described above, in the second embodiment, each battery monitoring apparatus 50 is configured to monitor one battery cell 42. Alternatively, each battery monitoring apparatus 50 may be configured to monitor a plurality of battery cells 42 (e.g., all the battery cells 42 of one battery module 41 or all the battery cells 42 of the entire battery pack 40). Moreover, some functions of the battery monitoring apparatus 50 may be shared by all the battery cells 42.

Figure 12:
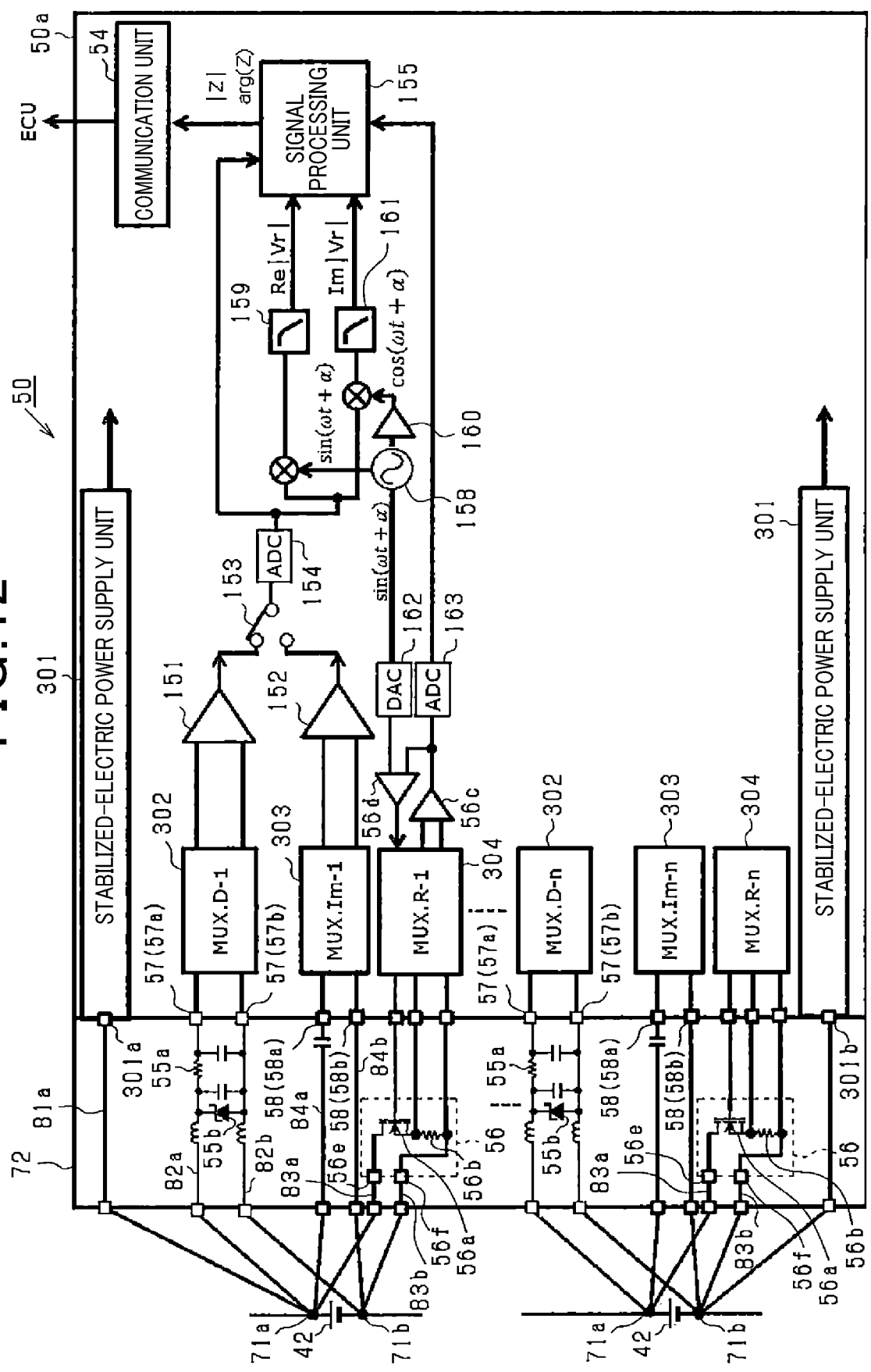
FIG. 12 is a configuration diagram of a battery monitoring apparatus according to a fifth embodiment.

FIG. 12 shows the configuration of a battery monitoring apparatus 50 according to the fifth embodiment.

As shown in FIG. 12, in the present embodiment, the stabilized-electric power supply unit 301, the communication unit 54, the differential amplifier 151, the preamplifier 152, the signal switch 153, the AD converters 154 and 163, the signal processing unit 155, the first multiplier 156, the second multiplier 157, the low-pass filters 159 and 161, the oscillating circuit 158, the phase-shift circuit 160, the DA converter 162, the feedback circuit 56*d* and the current detection amplifier 56*c* are shared by all the battery cells 42 of the battery pack 40 (or of one battery module 41).

Moreover, in the present embodiment, multiplexers 302-304 are employed to perform switching of various signals, such as the DC voltage, the response signal and the command signal, between the battery cells 42. In addition, the multiplexers 302-304 are controlled by, for example, the signal processing unit 155.

Next, the electrical connection between the battery cells 42 and the battery monitoring apparatus 50 according to the present embodiment will be described with reference to FIG. 13.

Figure 13:
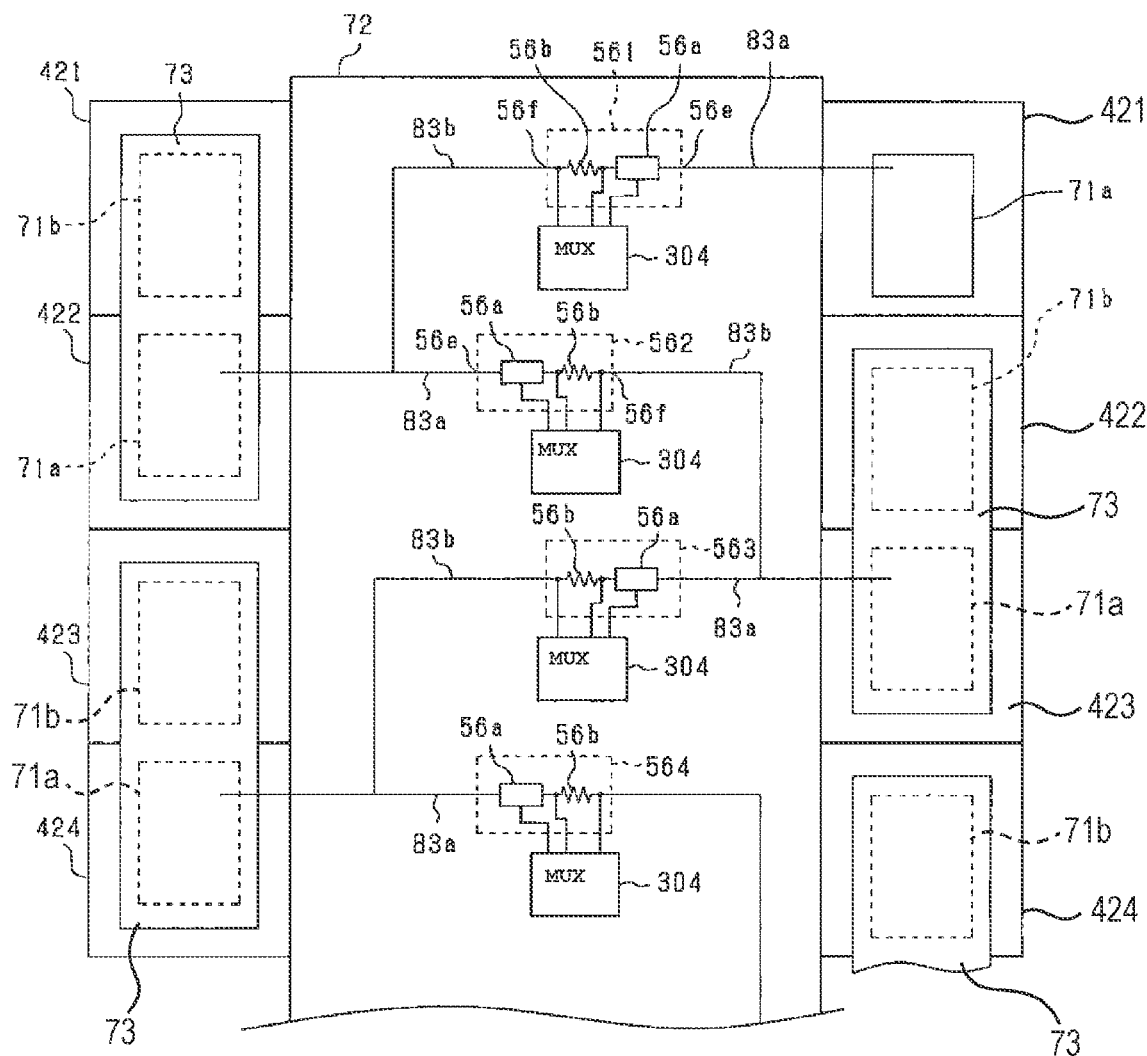
FIG. 13 is a schematic diagram illustrating the electrical connection between battery cells and the battery monitoring apparatus according to the fifth embodiment.

In the present embodiment, as shown in FIG. 13, each of the electric power supply terminals 71 of the battery cells 42 is connected with the corresponding electrical paths via the corresponding busbar 73. It should be noted that for the sake of simplicity, the second electrical paths 82 and the fourth electrical paths 84, which are formed in the same manner as in the second embodiment, are not shown in FIG. 13.

In the present embodiment, the third electrical paths 83 of the adjacent (or serially-connected) battery cells 42 are merged in pairs. Specifically, as shown in FIG. 13, the battery cells 42 are stacked in a lateral direction thereof (i.e., the vertical direction in FIG. 13) so that for each adjacent pair of the battery cells 42, the positive-electrode-side and negative-electrode-side electric power supply terminals 71*a* and 71*b* of one of the pair of the battery cells 42 are aligned in the lateral direction respectively with the negative-electrode-side and positive-electrode-side electric power supply terminals 71*b* and 71*a* of the other of the pair of the battery cells 42. Consequently, the positive-electrode-side electric power supply terminals 71*a* of the battery cells 42 are arranged alternately with the negative-electrode-side electric power supply terminals 71*b* of the battery cells 42 in the lateral direction. Moreover, for each of the battery cells 42, the positive-electrode-side electric power supply terminal 71*a* of the battery cell 42 is connected, via a busbar 73, to the negative-electrode-side electric power supply terminal 71*b* of that one of the battery cells 42 which is located on one lateral side of and adjacent to the battery cell 42; and the negative-electrode-side electric power supply terminal 71*b* of the battery cell 42 is connected, via a busbar 73, to the positive-electrode-side electric power supply terminal 71*a* of that one of the battery cells 42 which is located on the other lateral side of and adjacent to the battery cell 42. Consequently, all the battery cells 42 are electrically connected in series with each other via the busbars 73.

In addition, each of the busbars 73 is formed to extend in the lateral direction so as to connect one adjacent pair of the positive-electrode-side and negative-electrode-side electric power supply terminals 71*a* and 71*b* of the battery cells 42.

For the sake of convenience of explanation, the four battery cells 42 shown in FIG. 13 are sequentially numbered from the upper side as the first battery cell 421, the second battery cell 422, the third battery cell 423 and the fourth battery cell 424. Moreover, hereinafter, the current modulation circuit 56 configured to cause the sine-wave signal to be outputted from the first battery cell 421 will be referred to as the first current modulation circuit 561; the current modulation circuit 56 configured to cause the sine-wave signal to be outputted from the second battery cell 422 will be referred to as the second current modulation circuit 562; the current modulation circuit 56 configured to cause the sine-wave signal to be outputted from the third battery cell 423 will be referred to as the third current modulation circuit 563; and the current modulation circuit 56 configured to cause the sine-wave signal to be outputted from the fourth battery cell 424 will be referred to as the fourth current modulation circuit 564.

As shown in FIG. 13, the negative-electrode-side electric power supply terminal 71*b* of the first battery cell 421 is connected, via a busbar 73, to the positive-electrode-side electric power supply terminal 71*a* of the second battery cell 422. Moreover, the negative-electrode-side electric power supply terminal 71*b* of the second battery cell 422 is connected, via a busbar 73, to the positive-electrode-side electric power supply terminal 71*a* of the third battery cell 423. The negative-electrode-side electric power supply terminal 71*b* of the third battery cell 423 is connected, via a busbar 73, to the positive-electrode-side electric power supply terminal 71*a* of the fourth battery cell 424. The remaining electric power supply terminals 71 of the battery cells 42 are also connected in the same manner as those of the above-described first to fourth battery cells 421-424.

Moreover, as shown in FIG. 13, to the negative-electrode-side terminal 56*f* of the first current modulation circuit 561, there is connected a negative-electrode-side third electrical path 83*b*. The negative-electrode-side third electrical path 83*b* is bent toward a positive-electrode-side third electrical path 83*a* that is connected with the positive-electrode-side terminal 56*e* of the second current modulation circuit 562, thereby being merged with the positive-electrode-side third electrical path 83a into an electrical path; the electrical path is connected to the busbar 73 that connects the negative-electrode-side electric power supply terminal 71b of the first battery cell 421 and the positive-electrode-side electric power supply terminal 71a of the second battery cell 422.

That is, the negative-electrode-side third electrical path 83b extending from the first current modulation circuit 561 is connected to the negative-electrode-side electric power supply terminal 71b of the first battery cell 421 via the busbar 73. Similarly, the positive-electrode-side third electrical path 83a extending from the second current modulation circuit 562 is connected to the positive-electrode-side electric power supply terminal 71a of the second battery cell 422 via the busbar 73.

In the present embodiment, the multiplexers 302-304 are controlled by the signal processing unit 155 so as to allow signals to be inputted to and outputted from only one of the battery cells 42 which is selected as a monitoring target. For example, when the first battery cell 421 is selected as a monitoring target, the multiplexers 302-304 are controlled so as to: cause the sine-wave signal (or predetermined AC signal) to be outputted from only the first battery cell 421; and allow only the response signal of the first battery cell 421 to be inputted to the preamplifier 152.

Therefore, though the negative-electrode-side third electrical path 83b extending from the first current modulation circuit 561 is merged with the positive-electrode-side third electrical path 83a extending from the second current modulation circuit 562, operation of the first current modulation circuit 561 for causing the sine-wave signal to be outputted from the first battery cell 421 is prevented from being affected by the second battery cell 422. Similarly, when the second battery cell 422 is selected as a monitoring target, operation of the second current modulation circuit 562 for causing the sine-wave signal to be outputted from the second battery cell 422 is prevented from being affected by the first battery cell 421.

As above, in the present embodiment, each corresponding pair of the third electrical paths 83 provided respectively for the adjacent battery cells 42 are merged with each other. Consequently, it becomes possible to further reduce the number of the electrical paths joined to each of the electric power supply terminals 71 of the battery cells 42.

In addition, in the present embodiment, it is undesirable for the third electrical paths 83 to be merged with the second electrical paths 82 or with the fourth electrical paths 84. In other words, it is desirable for the third electrical paths 83 to be provided separately from the second electrical paths 82 and the fourth electrical paths 84. This is because if the third electrical paths 83 were merged with the second electrical paths 82 or with the fourth electrical paths 84, the lengths of the third electrical paths 83 to the electric power supply terminals 71 of the battery cells 42 would be increased and thus errors might occur due to additional resistance components (or impedance components).

On the other hand, the first electrical paths 81 may be either merged with the third electrical paths 83 or provided separately from the third electrical paths 83.

In addition, in the present embodiment, the current modulation circuits 56 may be supplied with drive electric power respectively by the battery cells 42 as in the first embodiment. In this case, the first electrical paths 81 may be merged with the third electrical paths 83 as in the first embodiment.

Sixth Embodiment

As described above, in the third embodiment, each battery monitoring apparatus 50 is configured to monitor one battery cell 42. Alternatively, each battery monitoring apparatus 50 may be configured to monitor a plurality of battery cells 42 (e.g., all the battery cells 42 of one battery module 41 or all the battery cells 42 of the entire battery pack 40). Moreover, some functions of the battery monitoring apparatus 50 may be shared by all the battery cells 42.

Figure 14:
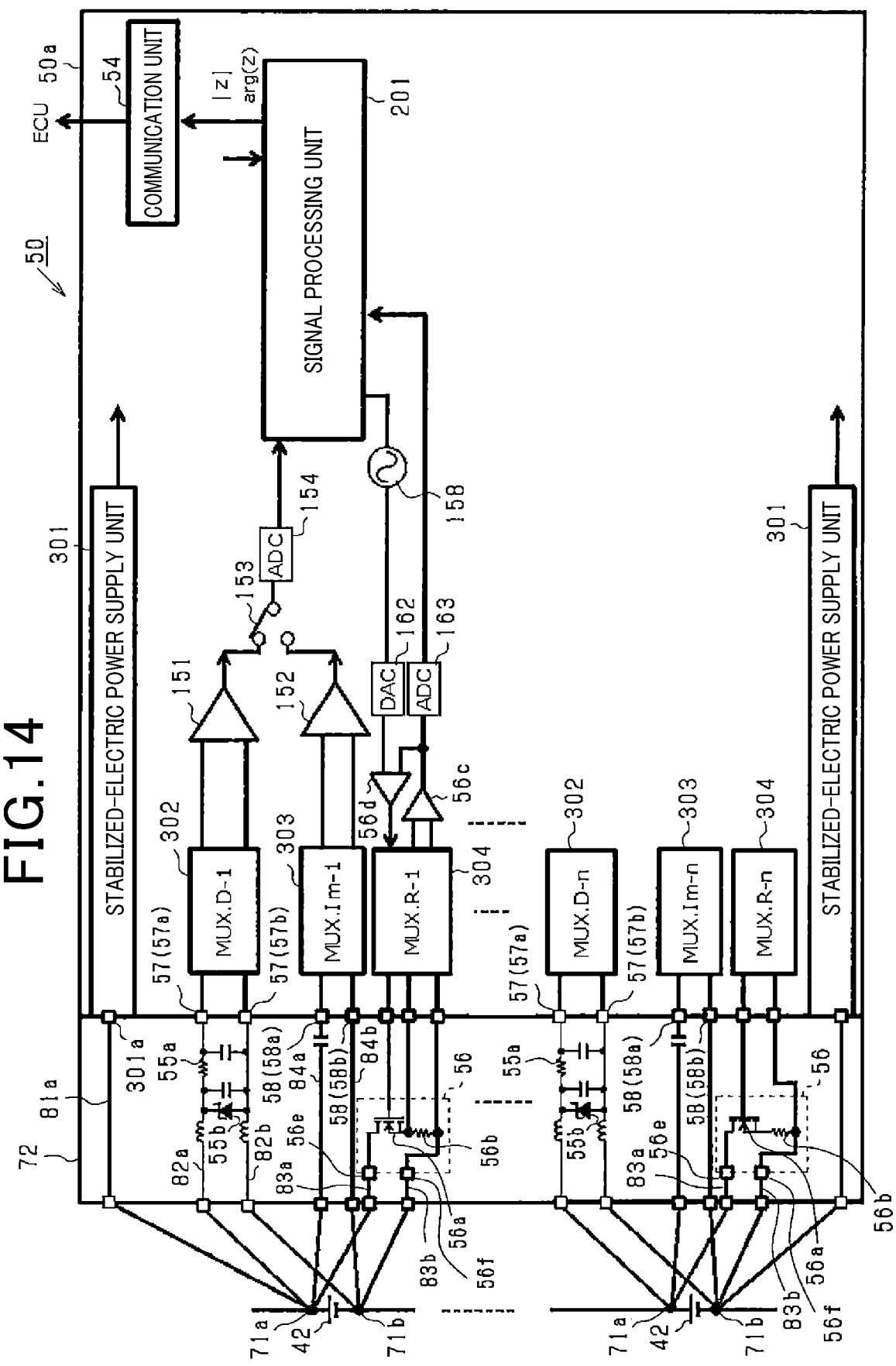
FIG. 14 is a configuration diagram of a battery monitoring apparatus according to a sixth embodiment.

FIG. 14 shows the configuration of a battery monitoring apparatus 50 according to the sixth embodiment.

As shown in FIG. 14, in the present embodiment, the stabilized-electric power supply unit 301, the communication unit 54, the differential amplifier 151, the preamplifier 152, the signal switch 153, the AD converters 154 and 163, the signal processing unit 201, the oscillating circuit 158, the DA converter 162, the feedback circuit 56d and the current detection amplifier 56c are shared by all the battery cells 42 of the battery pack 40 (or of one battery module 41).

Moreover, in the present embodiment, multiplexers 302-304 are employed to perform switching of various signals, such as the DC voltage, the response signal and the command signal, between the battery cells 42. In addition, the multiplexers 302-304 are controlled by, for example, the signal processing unit 201.

In the sixth embodiment, the battery cells 42 and the battery monitoring apparatus 50 are connected in the same manner as in the fourth embodiment or the fifth embodiment. Therefore, description of the connection between the battery cells 42 and the battery monitoring apparatus 50 is not repeated hereinafter.

While the above particular embodiments have been shown and described, it will be understood by those skilled in the art that various modifications, changes and improvements may be made without departing from the spirit of the present disclosure.

(1) In the above-described embodiments, the battery monitoring apparatus 50 may be powered by both a first electric power supply and a plurality of second electric power supplies. The first electric power supply is configured with a plurality of the battery cells 42 connected in series with each other. Moreover, the first electric power supply has a positive-electrode-side electric power supply terminal connected with that one of the positive electrodes of the plurality of battery cells 42 which has a highest electric potential and a negative-electrode-side electric power supply terminal connected with that one of the negative electrodes of the plurality of battery cells 42 which has a lowest electric potential. In contrast, each of the second electric power supplies is configured with a corresponding one of the battery cells 42. Moreover, each of the second electric power supplies has a pair of positive-electrode-side and negative-electrode-side electric power supply terminals connected respectively with the positive and negative electrodes of the corresponding battery cell 42.

Figure 15:
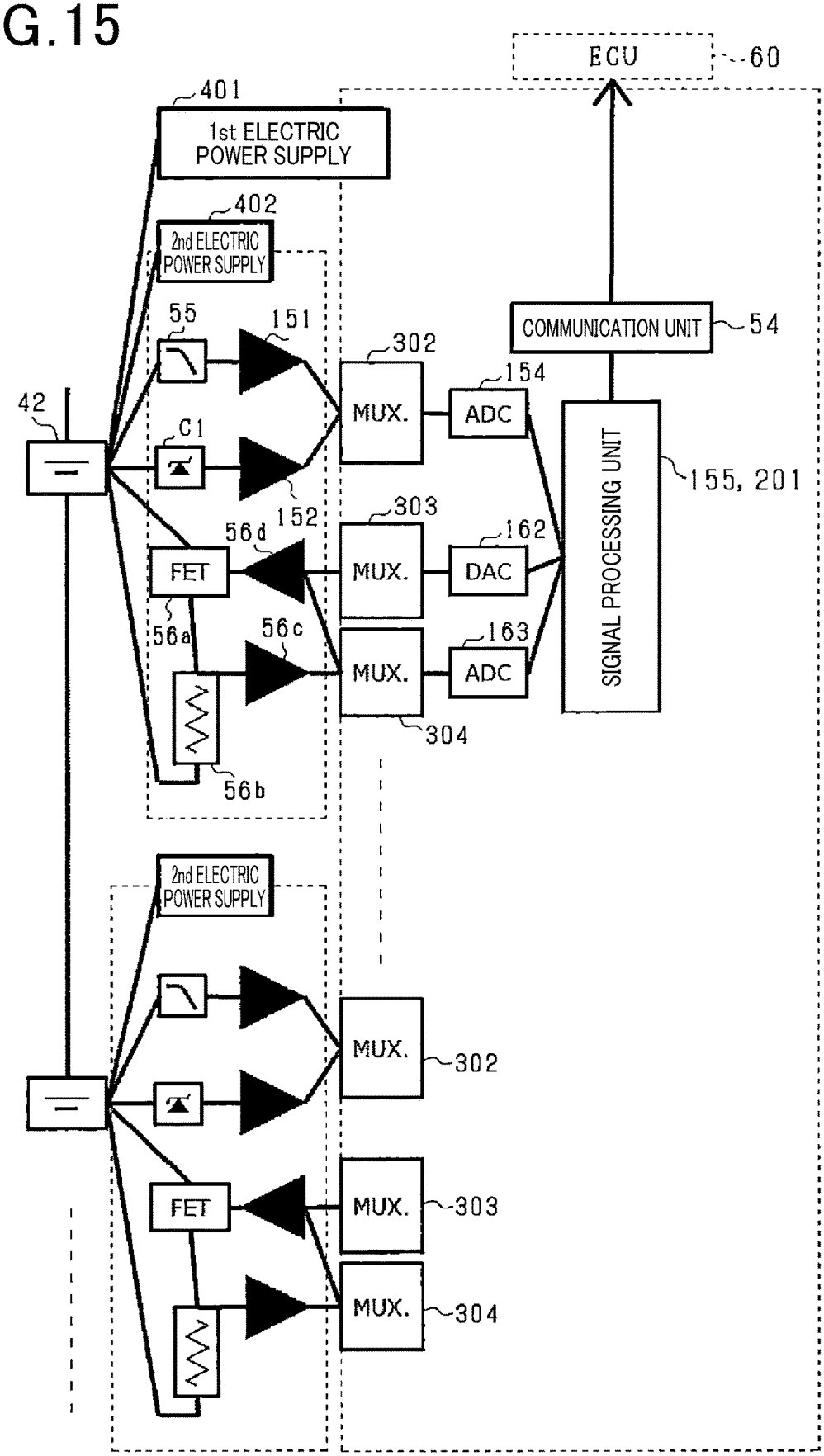
FIG. 15 is a configuration diagram of a battery monitoring apparatus according to a modification.

For example, in a modification shown in FIG. 15, the communication unit 54, the AD converters 154 and 163, the signal processing unit 155 or 201, the oscillating circuit 158, the phase-shift circuit 160 and the DA converter 162 are shared by all the battery cells 42. In addition, though the first multiplier 156, the second multiplier 157 and the low-pass filters 159 and 161 are not shown in FIG. 15, they may also be shared by all the battery cells 42 in the case of the signal processing unit 155 being employed to perform the two-phase lock-in detection.

Moreover, in the modification shown in FIG. 15, those components of the battery monitoring apparatus 50 which are shared by all the battery cells 42 are powered by a first electric power supply 401 that are configured with a plurality of battery cells 42 connected in series with each other. In contrast, each component set corresponding to only one of the battery cells 42 is powered by a second electric power supply 402 that is configured with the corresponding battery cell 42. In addition, the output voltage of the first electric power supply 401 is higher than the output voltage of each of the second electric power supplies 402.

Furthermore, in the modification shown in FIG. 15, multiplexers 302-304 are employed to perform switching of various signals, such as the DC voltage, the response signal and the command signal, between the battery cells 42.

(2) In the above-described embodiments, the battery monitoring apparatus 50 may be modified to further perform an equalization process for equalizing the states of charge and/or voltages of the battery cells 42. Specifically, the equalization process is a process for causing the battery cell(s) 42 having a higher SOC (i.e., state of charge) than the other battery cell(s) 42 to discharge and thereby equalizing the states of charge of all the battery cells 42. Consequently, it is possible to prevent the occurrence of a phenomenon where some of the battery cells 42 become overcharged.

Moreover, in the case of the battery monitoring apparatus 50 being modified to further perform the equalization process, each of the battery cells 42 may be caused by the corresponding current modulation circuit 56 to discharge. In this case, the battery monitoring apparatus 50 also functions as a discharge control unit.

For example, in the first embodiment, the equalization process may be performed by the microcomputer 53 as follows. Upon receipt of a discharge command that is issued by the ECU 60 based on the SOC of the battery cell 42 or upon the SOC or voltage of the battery cell 42 exceeding a predetermine threshold, the microcomputer 53 sends the command signal to the current modulation circuit 56. Then, upon receipt of the command signal, the current modulation circuit 56 causes a periodic-function signal (e.g., a sine-wave or rectangular-wave signal) or a DC signal to be outputted from the battery cell 42. Moreover, the microcomputer 53 continues sending the command signal to the current modulation circuit 56 until the discharge command has been terminated or the SOC or voltage of the battery cell 42 has been lowered below the predetermined threshold.

In addition, in the second to the sixth embodiments, the equalization process may be similarly performed by the microcomputer 53 or by the signal processing unit 155 or 201.

Furthermore, the complex impedance of the battery cell 42 may be calculated based on the response signal of the battery cell 42 to the sine-wave signal that is outputted for performing the equalization process. In this case, it is possible to suppress the consumption of electric power of the battery cell 42.

In addition, the strength of the sine-wave signal outputted for performing the equalization process is generally set to be low (or weak) for suppressing the electric power consumption and minimizing the size of the apparatus. Therefore, the battery monitoring apparatuses 50 according to the second and fifth embodiments, which are configured to perform the two-phase lock-in detection, are particularly suitable for performing the equalization process.

(3) In the above-described embodiments, the filter unit 55 is implemented by the semiconductor elements. Alternatively, the filter unit 55 may be implemented by, instead of or in combination with the semiconductor elements, wirings, connector contacts, and pattern wirings and/or solid patterns formed on a printed board.

(4) In the above-described embodiments, a filter circuit may be provided between the current modulation circuit 56 and the input/output unit 52 (or the DA converter 162). In this case, it is possible to suppress, with the filter circuit, occurrence of an error in the waveform of the command signal during the digital-to-analog conversion of the command signal.

(5) In the above-described embodiments, some or all of the differential amplifier 151, the preamplifier 152, the signal switch 153, the AD converters 154 and 163, the signal processing unit 155, the first multiplier 156, the second multiplier 157, the low-pass filters 159 and 161, the oscillating circuit 158, the phase-shift circuit 160, the DA converter 162, the feedback circuit 56d and the current detection amplifier 56c may be realized by software.

(6) In the above-described second and third embodiments, the capacitor C1 may be omitted from the battery monitoring apparatus 50.

(7) In the above-described embodiments, the feedback circuit 56d may be omitted from the battery monitoring apparatus 50. Moreover, the current single flowing through the resistor 56b may not be detected by the current detection amplifier 56c. Furthermore, the microcomputer 53 and the signal processing unit 155 or 201 may have no feedback signal inputted thereinto.

(8) In the above-described embodiments, the DC voltage of the battery cell 42 that is the monitoring target is detected by the battery monitoring apparatus 50. However, the DC voltage of the battery cell 42 may not be detected by the battery monitoring apparatus 50.

(9) In the above-described second, third, fifth and sixth embodiments, the signal switch 153 may be omitted from the battery monitoring apparatus 50. In this case, the measured DC voltage may be directly inputted the signal processing unit 155 or 201.

(10) In the above-described second, third, fifth and sixth embodiments, the feedback signal may also be selected by the signal switch 153. In other words, the signal switch 153 may alternatively be configured to select between the DC voltage, the response signal and the feedback signal. In this case, it is possible to omit the AD converter 163 and perform all the analog-to-digital conversions of the DC voltage, the response signal and the feedback signal using the single AD converter 154.

(11) The battery monitoring apparatuses 50 according to the above-described embodiments may be applied to a HEV (Hybrid Electric Vehicle), an EV (Electric Vehicle), a PHV (Plug-in Hybrid Vehicle), an automotive accessory battery, an electric aircraft, an electric motorcycle and an electric ship.

(12) In the above-described embodiments, the battery cells 42 are connected in series with each other. Alternatively, the battery cells 42 may be connected in parallel with each other.

(13) In the above-described second, third, fifth and sixth embodiments, to prevent occurrence of aliasing during the analog-to-digital conversion by the AD converter 154, a filter circuit may be provided immediately before or after the preamplifier 152, or immediately before the AD converter 154.

(14) In the above-described embodiments, each battery monitoring apparatus 50 may be configured to monitor a state of one battery module 41. In this case, the communications from the communication units 54 of the battery monitoring apparatuses 50, which respectively monitor the battery modules 41, to the ECU 60 may be isolated-communications having different electric potential references. The isolated-communications may be realized using, for example, an isolation transformer or capacitor.

(15) In the above-described second and fifth embodiments, the feedback signal may also be lock-in-detected.

Figure 16:
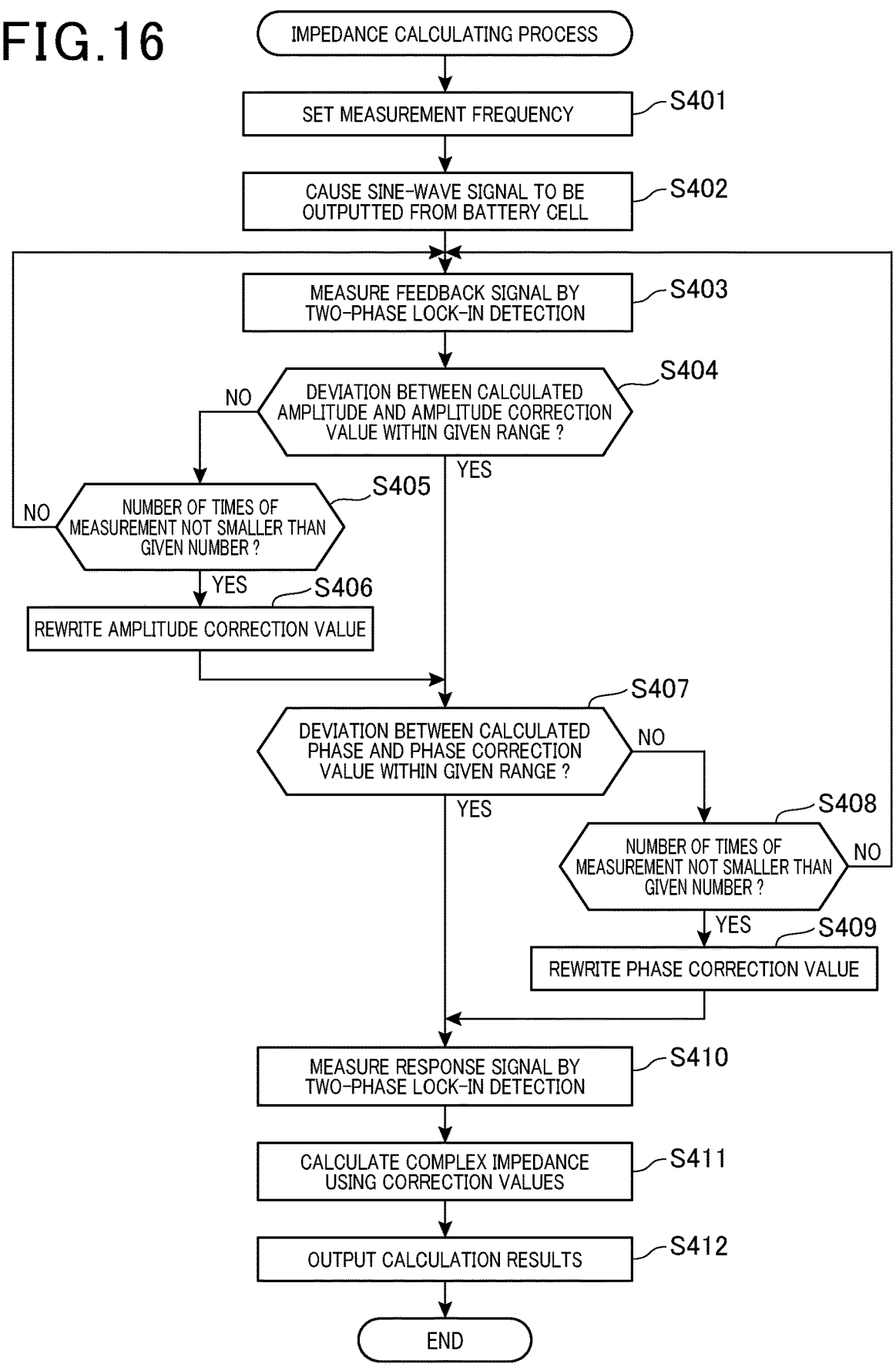
FIG. 16 is a flow chart illustrating a complex impedance calculating process according to another modification.

For example, FIG. 16 illustrates a complex impedance calculating process in which two-phase lock-in detection is performed on the feedback signal as well as on the response signal. This process is repeatedly performed by the battery monitoring apparatus 50 in a predetermined cycle.

In the complex impedance calculating process, first, in step S401, the oscillating circuit 158 sets a measurement frequency of the complex impedance within a predetermined frequency range. In addition, the measurement frequency is determined by, for example, the signal processing unit 155.

In step S402, the oscillating circuit 158 sets the frequency of the sine-wave signal (or predetermined AC signal) based on the measurement frequency set in step S401. Then, the oscillating circuit 158 outputs the command signal, through the digital-to-analog conversion by the DA converter 162, to the current modulation circuit 56 via the command signal output terminal 59a. As described previously, the command signal is indicative of a command commanding the current modulation circuit 56 to cause the sine-wave signal to be outputted from the battery cell 42. Upon receipt of the command signal, the current modulation circuit 56 causes the sine-wave signal to be outputted from the battery cell 42 that is the monitoring target, with the battery cell 42 itself being the electric power source for the output of the sine-wave signal. Consequently, the sine-wave signal is outputted from the battery cell 42.

In step S403, the signal processing unit 155 measures the feedback signal by the two-phase lock-in detection. Specifically, the signal processing unit 155 multiplies the sine-wave signal (or reference signal) commanded by the oscillating circuit 158 and the inputted feedback signal together. Moreover, the signal processing unit 155 multiplies a signal, which is obtained by shifting the phase of the sine-wave signal commanded by the oscillating circuit 158 by 90°, and the inputted feedback signal together. Then, based on the multiplication results, the signal processing unit 155 calculates both the amplitude and the phase of the feedback signal.

In step S404, the signal processing unit 155 determines whether the deviation between the calculated amplitude of the feedback signal and an amplitude correction value is within a given amplitude-deviation range. Here, the amplitude correction value denotes the amplitude of the sine-wave signal desired to be outputted from the battery cell 42.

If the determination in step S404 results in a "NO" answer, then the process proceeds to step S405. In contrast, if the determination in step S404 results in a "YES" answer, then the process proceeds to step S407.

In step S405, the signal processing unit 155 further determines whether the number of times of measurement of the feedback signal in step S403 has been increased to become not smaller than (i.e., greater than or equal to) a given number.

If the determination in step S405 results in a "NO" answer, then the signal processing unit 155 increases the number of times of measurement of the feedback signal by one. Thereafter, the process returns to step S403 to repeat step S403 and the subsequent steps.

On the other hand, if the determination in step S405 results in a "YES" answer, then the process proceeds to step S406.

In step S406, the signal processing unit 155 calculates an average value of the measured amplitudes of the feedback signal and rewrites the amplitude correction value to the average value. Then, the signal processing unit 155 clears the number of times of measurement. Thereafter, the process proceeds to step S407.

In step S407, the signal processing unit 155 determines whether the deviation between the phase of the feedback signal calculated in step S403 and a phase correction value is within a given phase-deviation range. Here, the phase correction value denotes the phase of the sine-wave signal desired to be outputted from the battery cell 42.

If the determination in step S407 results in a "NO" answer, then the process proceeds to step S408. In contrast, if the determination in step S407 results in a "YES" answer, then the process proceeds to step S410.

In step S408, the signal processing unit 155 further determines whether the number of times of measurement of the feedback signal in step S403 has been increased to become not smaller than (i.e., greater than or equal to) the given number.

If the determination in step S408 results in a "NO" answer, then the signal processing unit 155 increases the number of times of measurement of the feedback signal by one. Thereafter, the process returns to step S403 to repeat step S403 and the subsequent steps.

On the other hand, if the determination in step S408 results in a "YES" answer, then the process proceeds to step S409.

In step S409, the signal processing unit 155 calculates an average value of the measured phases of the feedback signal and rewrites the phase correction value to the average value. Then, the signal processing unit 155 clears the number of times of measurement. Thereafter, the process proceeds to step S410.

In step S410, the signal processing unit 155 measures the response signal by the two-phase lock-in detection. For example, the response signal may be measured by performing steps S202, S205 and S206 of the complex impedance calculating process according to the second embodiment (see FIG. 7).

In step S411, the signal processing unit 155 calculates, based on the feedback signal and the signals (or values respectively proportional to the real and imaginary parts of the response signal) from the low-pass filters 159 and 161, at least one of the real part, the imaginary part, the absolute value and the phase of the complex impedance of the battery cell 42. Here, the feedback signal is represented by both the amplitude correction value and the phase correction value. The feedback signal is used to correct (or eliminate) any deviation in amplitude or phase between the current signal actually outputted from the battery cell 42 and the sine-wave signal desired to be outputted from the battery cell 42.

In step S412, the signal processing unit 155 outputs the calculation results to the ECU 60 via the communication unit 54. Then, the complex impedance calculating process terminates.

In the above-described complex impedance calculating process, the feedback signal is also measured by the two-phase lock-in detection. Therefore, with the above process, it is possible to accurately measure the current signal actually outputted from the battery cell 42 even in an environment where noise is present. Accordingly, using the feedback signal measured by the two-phase lock-in detection, it is possible to further improve the accuracy of calculation of the complex impedance of the battery cell 42.

(16) In the above-described embodiments, the current signal caused to be outputted from the battery cell 42 is not limited to the sine-wave signal. The current signal may alternatively be other AC signals, such as a rectangular-wave signal or a triangular-wave signal.

(17) In the above-described embodiments, the ECU 60 may be constituted of a plurality of ECUs. Moreover, the ECUs may be provided to respectively perform different functions or to respectively control different control targets. For example, the ECUs may include a battery ECU and an inverter ECU.

(18) In the above-described embodiments, in the case of performing the lock-in detection, the sine-wave signal commanded by the oscillating circuit 158 is used as the first reference signal. Alternatively, the detected signal (i.e., the feedback signal) may be used as the first reference signal. Moreover, in the case of performing the two-phase lock-in detection, a signal, which is obtained by shifting the phase of the detected signal (i.e., the feedback signal), may be used as the second reference signal.

(19) In the above-described embodiments, the battery cells 42 (or the battery modules 41 or the battery pack 40) may be configured to be used as an electric power source for peripheral circuits during the output of the sine-wave signal (or the output of the response signal) therefrom according to the command signal. In contrast, the battery cells 42 (or the battery modules 41 or the battery pack 40) may also be configured to be not used as an electric power source for peripheral circuits during the output of the sine-wave signal (or the output of the response signal) therefrom according to the command signal.

Figure 17:
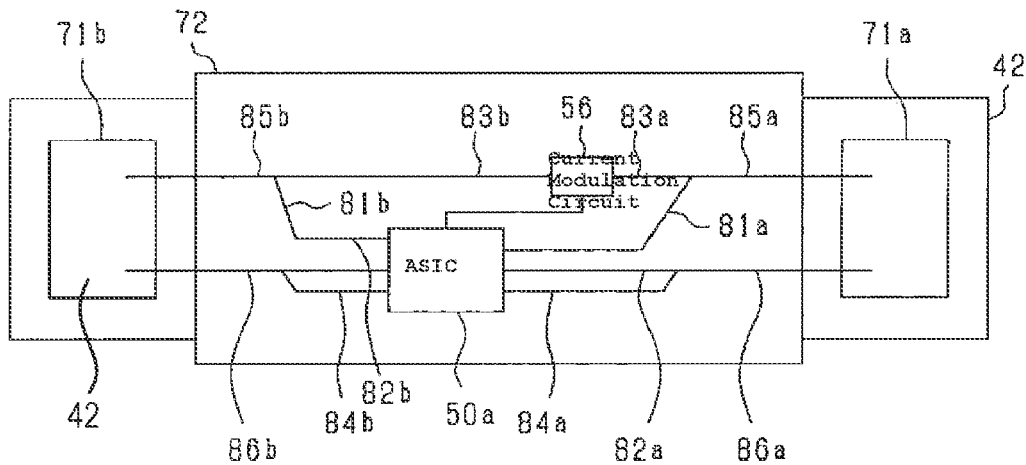
FIG. 17 is a schematic diagram illustrating the electrical connection between a battery cell and a battery monitoring apparatus according to yet another modification.

(20) In the above-described embodiments, as shown in FIG. 17, the second electrical paths 82 may be respectively merged with the fourth electrical paths 84 into sixth electrical paths 86 (i.e., 86a and 86b); and the sixth electrical paths 86 may be respectively joined to the electric power supply terminals 71 (i.e., 71a and 71b) of the battery cell 42. In this case, it is possible to further reduce the number of the electrical paths of the battery monitoring apparatus 50 joined to the electric power supply terminals 71 of the battery cell 42.

In addition, the response signal and the DC voltage of the battery cell 42 are inputted to the battery monitoring apparatus 50 at different times. Therefore, the response signal and the DC voltage will not affect each other even if the second electrical paths 82 are respectively merged with the fourth electrical paths 84.

Figure 18:
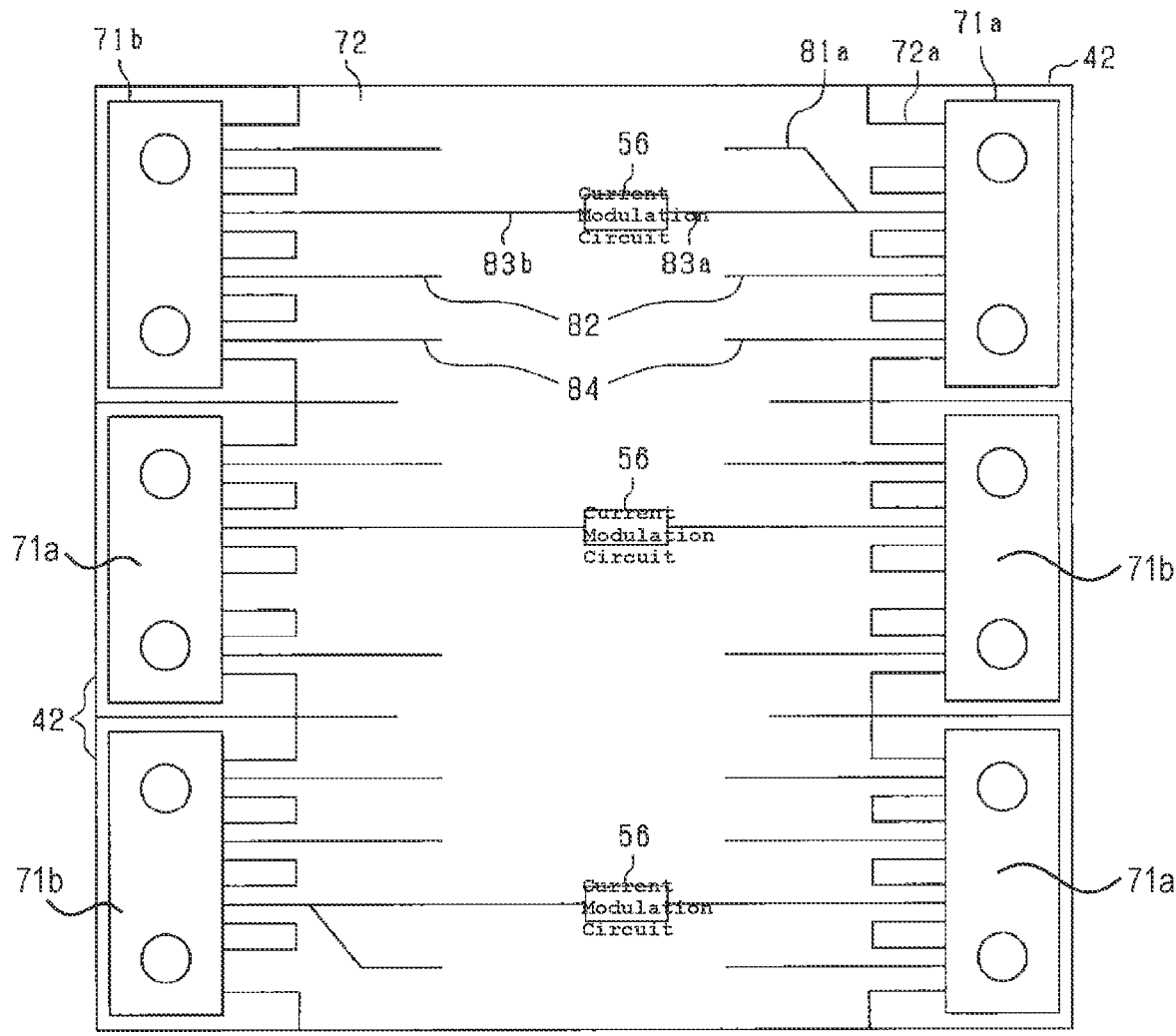
FIG. 18 is a schematic diagram illustrating a circuit board of a battery monitoring apparatus according to still another modification.

(21) In the above-described embodiments, as shown in FIG. 18, the circuit board 72 may be configured to have protruding parts 72a each of which protrudes to a corresponding one of the electric power supply terminals 71 (i.e., 71a and 71b) of the battery cells 42 in the longitudinal direction of the battery cells 42. Moreover, the battery-cell-side end portions of the electrical paths may be provided respectively on the protruding parts 72a of the circuit board 72.

In addition, in the case of providing a plurality of circuit boards 72 respectively for the battery cells 42, it is desirable to configure all the circuit boards 72 to have the same shape and size. In this case, it is possible to reduce the time and cost for manufacturing the battery monitoring apparatuses 50.

The control units and control methods described in the present disclosure may be realized by a dedicated computer which includes a processor and a memory to perform one or more functions through execution of a computer program. As an alternative, the control units and control methods described in the present disclosure may be realized by a dedicated computer which includes one or more hardware logic circuits to perform one or more functions. As another alternative, the control units and control methods described in the present disclosure may be realized by a dedicated computer which includes a processor and a memory to perform one or more functions through execution of a computer program as well as one or more hardware logic circuits to perform one or more functions. In addition, the computer program may be stored, as instructions executed by the computer, in a computer-readable, non-transitory and tangible recording medium.

What is claimed is:

1. A battery monitoring apparatus for monitoring a state of a storage battery, the battery monitoring apparatus comprising:
an electric power supply terminal which is connected with a first electrical path and via which drive electric power for driving the battery monitoring apparatus is supplied from the storage battery to the battery monitoring apparatus through the first electrical path;
a voltage input terminal which is connected with a second electrical path and via which a terminal voltage of the storage battery is inputted to the battery monitoring apparatus through the second electrical path so as to be measured by the battery monitoring apparatus;
a signal control unit connected with a third electrical path and configured to cause a predetermined AC signal to be outputted from the storage battery to the battery monitoring apparatus through the third electrical path, the signal control unit being configured to cause the predetermined AC signal to be outputted from the storage battery with the storage battery itself being an electric power source for the output of the predetermined AC signal;
a response signal input terminal which is connected with a fourth electrical path and via which a response signal generated by the storage battery in response to the output of the AC signal is inputted to the battery monitoring apparatus through the fourth electrical path; and
a calculating unit configured to calculate, based on the response signal, a complex impedance of the storage battery,
wherein
at least one of the first electrical path, the second electrical path, the third electrical path and the fourth electrical path is merged with at least one other of the electrical paths into an electrical path that is connected to the storage battery.

2. The battery monitoring apparatus as set forth in claim 1, wherein the first electrical path is merged with the third electrical path into a fifth electrical path that is connected to the storage battery.

3. The battery monitoring apparatus as set forth in claim 1, wherein the second electrical path is provided separately from the first electrical path and the third electrical path.

4. The battery monitoring apparatus as set forth in claim 1, wherein the fourth electrical path is provided separately from the first electrical path and the third electrical path.

5. The battery monitoring apparatus as set forth in claim 1, wherein the second electrical path is merged with the fourth electrical path into a sixth electrical path that is connected to the storage battery.

6. The battery monitoring apparatus as set forth in claim 1, wherein storage-battery-side end portions of the electrical paths are respectively joined to different portions of an electric power supply terminal of the storage battery, and
among the different portions of the electric power supply terminal of the storage battery, the portion to which the storage-battery-side end portion of the fourth electrical path is located closest to an electrode of the storage battery, the electrode of the storage battery being connected with the electric power supply terminal of the storage battery.

7. The battery monitoring apparatus as set forth in claim 1, wherein the storage battery is included in a battery pack,
the battery pack includes a plurality of storage batteries each having a pair of electric power supply terminals,
each corresponding pair of the electric power supply terminals of the plurality of storage batteries are connected with each other via a busbar, and
at least a storage-battery-side end portion of the electrical path connected with the response signal input terminal is directly joined to a corresponding one of the electric power supply terminals of the storage battery whose state is monitored by the battery monitoring apparatus, without any busbar interposed between the storage-battery-side end portion of the electrical path and the corresponding electric power supply terminal of the storage battery.

8. The battery monitoring apparatus as set forth in claim 1, wherein the storage battery is included in a battery pack,
the battery pack includes a plurality of storage batteries each having a pair of positive and negative electrodes and a pair of positive-electrode-side and negative-electrode-side electric power supply terminals connected respectively with the positive and negative electrodes,
each corresponding pair of the positive-electrode-side and negative-electrode-side electric power supply terminals of the plurality of storage batteries are connected with each other via a busbar so that all the plurality of storage batteries are electrically connected in series with each other,
the battery monitoring apparatus comprises a plurality of sets of the voltage input terminal, the signal control unit, the response signal input terminal and the second to the fourth electrical paths, each set being provided to monitor a state of a corresponding one of the plurality of storage batteries, and the electric power supply terminal and the first electrical path both of which are shared by all the plurality of storage batteries,
the electric power supply terminal of the battery monitoring apparatus comprises a positive-electrode-side electric power supply terminal and a negative-electrode-side electric power supply terminal,
the first electrical path comprises a positive-electrode-side first electrical path connected with the positive-electrode-side electric power supply terminal of the battery monitoring apparatus and a negative-electrode-side first electrical path connected with the negative-electrode-side electric power supply terminal of the battery monitoring apparatus,
the positive-electrode-side first electrical path is merged with the third electrical path that is connected with the positive-electrode-side electric power supply terminal of one of the plurality of storage batteries which has a highest electric potential in the battery pack, and
the negative-electrode-side first electrical path is merged with the third electrical path that is connected with the negative-electrode-side electric power supply terminal of one of the plurality of storage batteries which has a lowest electric potential in the battery pack.

9. The battery monitoring apparatus as set forth in claim 1, wherein the storage battery is included in a battery pack,
the battery pack includes a plurality of storage batteries each having a pair of positive and negative electrodes and a pair of positive-electrode-side and negative-electrode-side electric power supply terminals connected respectively with the positive and negative electrodes,
the signal control unit has a positive-electrode-side terminal and a negative-electrode-side terminal,
the third electrical path comprises a positive-electrode-side third electrical path connected with the positive-electrode-side terminal of the signal control unit and a negative-electrode-side third electrical path connected with the negative-electrode-side terminal of the signal control unit,
the battery monitoring apparatus comprises a plurality of sets of the signal control unit and the third electrical path, each set being provided to monitor a state of a corresponding one of the plurality of storage batteries,
the plurality of storage batteries include a first storage battery and a second storage battery that are arranged adjacent to each other,
the negative-electrode-side electric power supply terminal of the first storage battery is connected with the positive-electrode-side electric power supply terminal of the second storage battery via a busbar, and
the negative-electrode-side third electrical path connected with the negative-electrode-side terminal of the signal control unit corresponding to the first storage battery is merged with the positive-electrode-side third electrical path connected with the positive-electrode-side terminal of the signal control unit corresponding to the second storage battery into an electrical path that is connected to the busbar.

* * * * *